US012660423B2

(12) United States Patent (10) Patent No.: US 12,660,423 B2
Murofushi et al. (45) Date of Patent: Jun. 16, 2026

(54) DISPLAY DEVICE AND METHOD FOR MANUFACTURING DISPLAY DEVICE

(71) Applicant: Sharp Display Technology Corporation, Kameyama City (JP)

(72) Inventors: Norio Murofushi, Kameyama City (JP); Tohru Sonoda, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 482 days.

(21) Appl. No.: 18/284,185

(22) PCT Filed: Apr. 22, 2021

(86) PCT No.: PCT/JP2021/016280
§ 371 (c)(1),
(2) Date: Sep. 26, 2023

(87) PCT Pub. No.: WO2022/224398
PCT Pub. Date: Oct. 27, 2022

(65) Prior Publication Data
US 2024/0164145 A1 May 16, 2024

(51) Int. Cl.
*H10K 59/122* (2023.01)
*H10K 59/12* (2023.01)

(52) U.S. Cl.
CPC ....... *H10K 59/122* (2023.02); *H10K 59/1201* (2023.02)

(58) Field of Classification Search
CPC .. H10K 59/122; H10K 59/1201; H10K 59/35; H10K 71/166; H10K 59/352; G09F 9/30
See application file for complete search history.

(56) References Cited

U.S. PATENT DOCUMENTS

| | | | |
|---|---|---|---|
| 2013/0181242 A1* | 7/2013 | Cho ........................ | H10K 77/10 |
| | | | 257/E51.026 |
| 2021/0257423 A1 | 8/2021 | Furuie | |
| 2021/0257579 A1 | 8/2021 | Okabe et al. | |
| 2021/0288290 A1* | 9/2021 | Lee ........................ | H10K 50/16 |
| 2021/0296616 A1* | 9/2021 | Song .................... | H10K 50/131 |
| 2022/0020828 A1* | 1/2022 | Lee ........................ | H10K 59/878 |

FOREIGN PATENT DOCUMENTS

| | | |
|---|---|---|
| JP | 2020-080224 A | 5/2020 |
| WO | 2020/039555 A1 | 2/2020 |

* cited by examiner

*Primary Examiner* — Kevin Quarterman
(74) *Attorney, Agent, or Firm* — ScienBiziP, P.C.

(57) ABSTRACT

A display device includes the following: a plurality of first spacers provided at a first pitch that is constant, in a given direction in the display region except where light-emitting elements are provided, the plurality of first spacers having heights that are identical; and n–1 second spacers provided between two of the plurality of first spacers adjacent to each other in the given direction, except where the light-emitting elements are provided, the n–1 second spacers having heights that are smaller than the heights of the plurality of first spacers, where n is a natural number equal to or greater than two. The pitch in the given direction of all spacers including the plurality of first spacers and the n–1 second spacers is a second pitch that is constant, and that is the first pitch divided into n equal parts.

16 Claims, 12 Drawing Sheets

FIG. 6

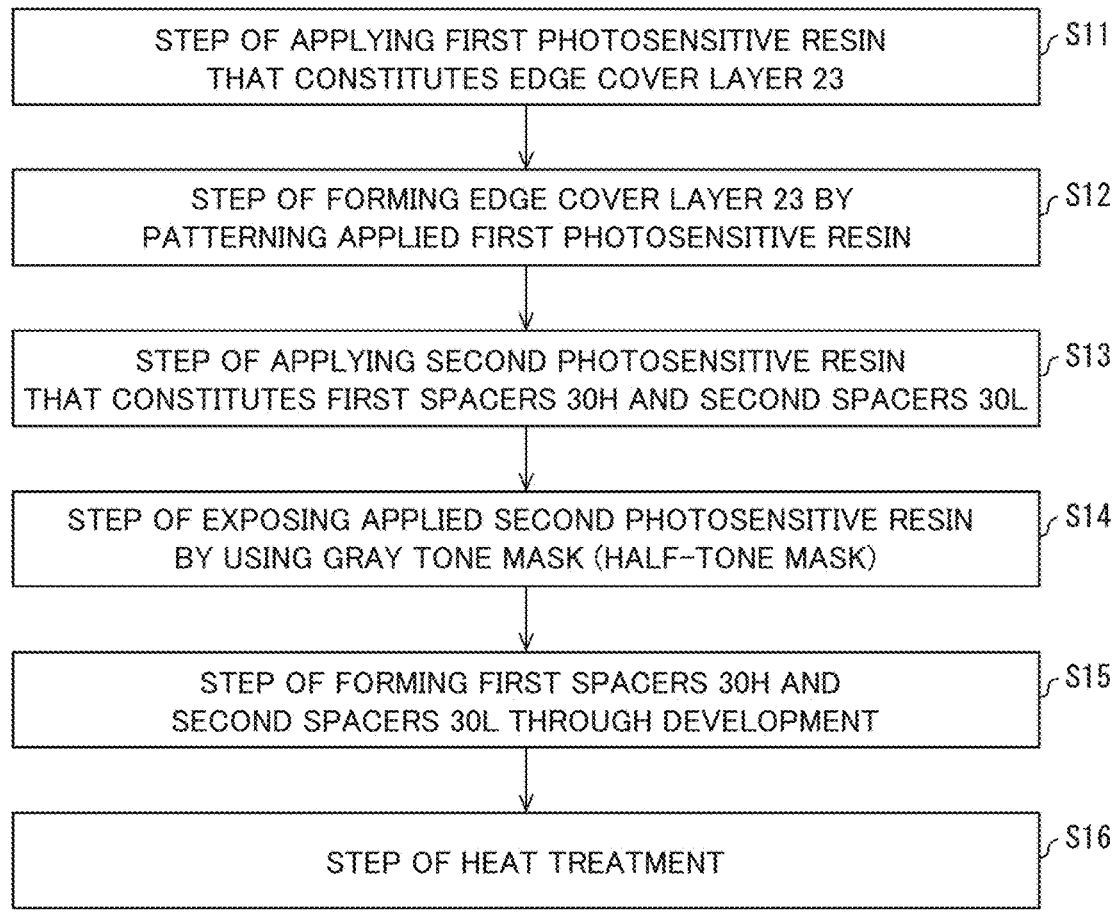

STEP OF APPLYING FIRST PHOTOSENSITIVE RESIN
THAT CONSTITUTES EDGE COVER LAYER 23 — S11

STEP OF FORMING EDGE COVER LAYER 23 BY
PATTERNING APPLIED FIRST PHOTOSENSITIVE RESIN — S12

STEP OF APPLYING SECOND PHOTOSENSITIVE RESIN
THAT CONSTITUTES FIRST SPACERS 30H AND SECOND SPACERS 30L — S13

STEP OF EXPOSING APPLIED SECOND PHOTOSENSITIVE RESIN
BY USING GRAY TONE MASK (HALF-TONE MASK) — S14

STEP OF FORMING FIRST SPACERS 30H AND
SECOND SPACERS 30L THROUGH DEVELOPMENT — S15

STEP OF HEAT TREATMENT — S16

FIG. 7

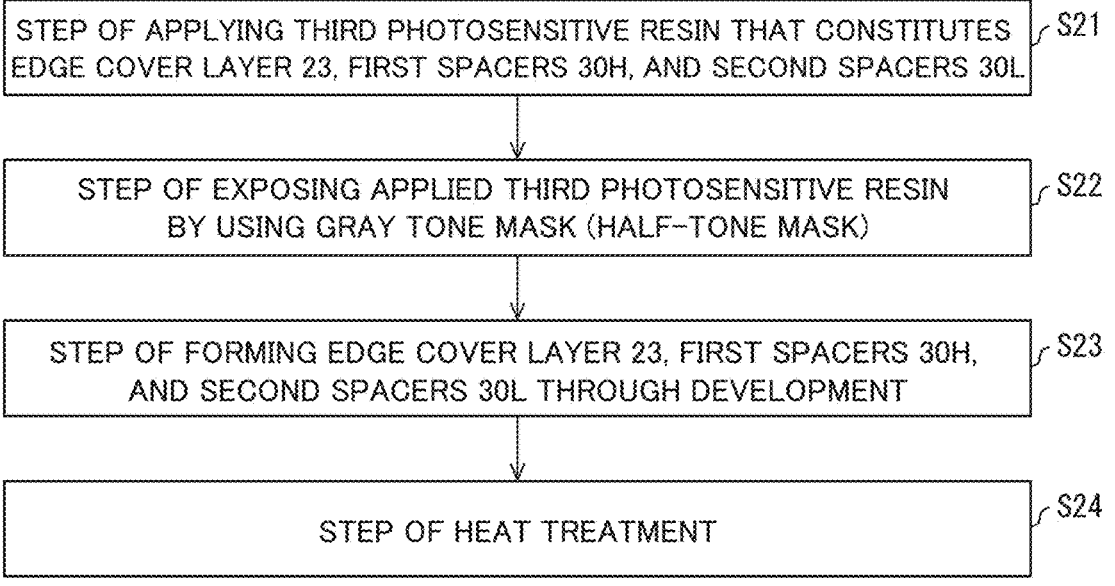

STEP OF APPLYING THIRD PHOTOSENSITIVE RESIN THAT CONSTITUTES
EDGE COVER LAYER 23, FIRST SPACERS 30H, AND SECOND SPACERS 30L — S21

STEP OF EXPOSING APPLIED THIRD PHOTOSENSITIVE RESIN
BY USING GRAY TONE MASK (HALF-TONE MASK) — S22

STEP OF FORMING EDGE COVER LAYER 23, FIRST SPACERS 30H,
AND SECOND SPACERS 30L THROUGH DEVELOPMENT — S23

STEP OF HEAT TREATMENT — S24

| SAMPLE | LL/HH | RELATIVE AMOUNT OF FOREIGN-SUBSTANCE TRANSFER(%) | FALSE DETECTION IN HIGH-SENSITIVITY (HIGH-PRECISION) INSPECTION | CAPABILITY OF IJ APPLICATION |
|---|---|---|---|---|
| DISPLAY DEVICE 100 | 0 | 30 | PRESENCE | ◎ |
| DISPLAY DEVICE 1 | 0.2 | 32 | ABSENCE | ◎ |
| DISPLAY DEVICE 1' | 0.45 | 34 | ABSENCE | ◎ to ○ |
| DISPLAY DEVICE 1'' | 0.75 | 36 | ABSENCE | ○ |
| DISPLAY DEVICE 200 | 1 | 100 | ABSENCE | × |

FIG. 15
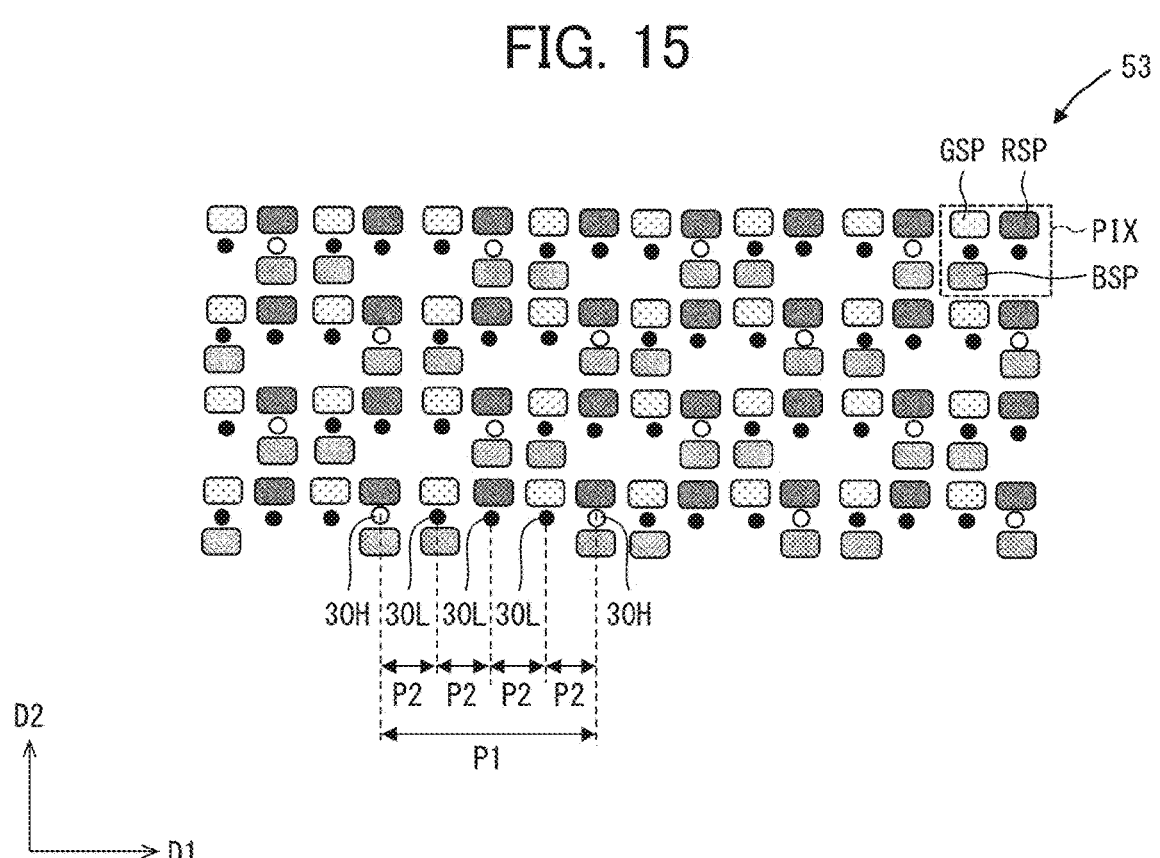
FIG. 16
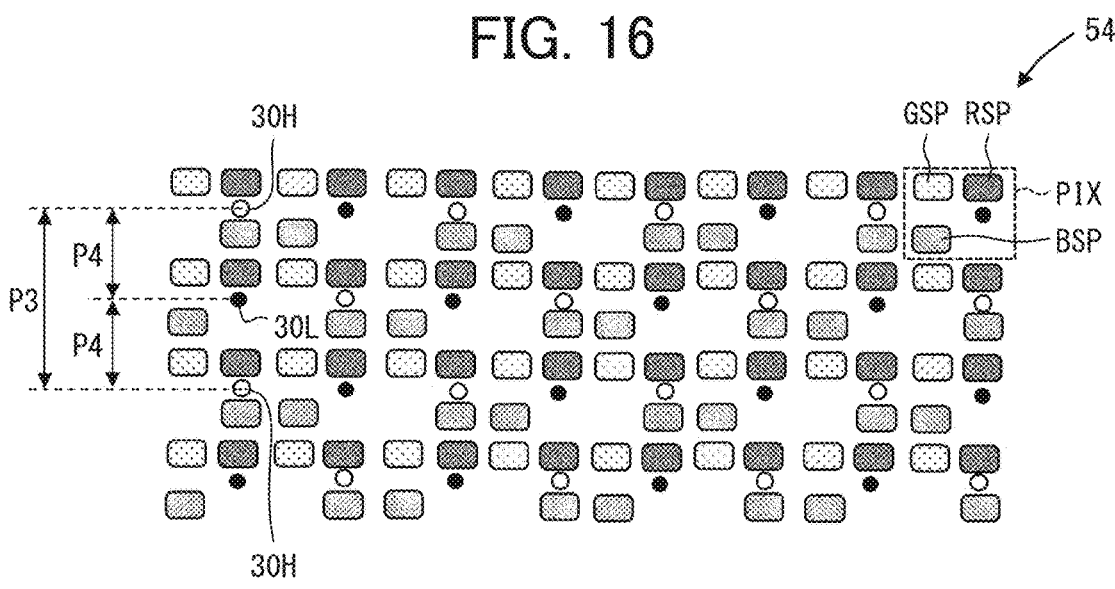
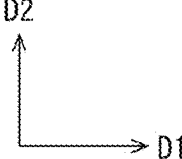

DISPLAY DEVICE AND METHOD FOR MANUFACTURING DISPLAY DEVICE

TECHNICAL FIELD

The present disclosure relates to a display device, and a method for manufacturing a display device.

BACKGROUND ART

Various display devices that include light-emitting elements have been recently developed, among which display devices that include organic light-emitting diodes (OLEDs) or quantum-dot light-emitting diodes (QLEDs) can achieve low power consumption, slimming down, high image quality, and other things and thus have received considerable attention.

Process steps for manufacturing a display device that includes OLEDs or QLEDs typically use evaporation masks, such as a fine metal mask, which is used in forming an evaporated film that is different for each of the subpixels of respective colors, and a common metal mask, which is used in forming the same evaporated film all over its display region.

A process step for manufacturing a display device that includes OLEDs often includes forming respective light-emitting layers through evaporation using three different fine metal masks; for instance, a red light-emitting layer is formed in a red subpixel using one fine metal mask, a green light-emitting layer is formed in a green subpixel using another fine metal mask, and a blue light-emitting layer is formed in a blue subpixel using still another fine metal mask. Further, forming function layers, such as a hole injection layer, a hole transport layer, an electron transport layer, and an electron injection layer, often uses at least one of a fine metal mask and a common metal mask as necessary, and forming a transparent common electrode composed of a transparent metal oxide often uses a common metal mask.

Like the foregoing process step for manufacturing the OLED display device, process steps for manufacturing a display device that includes QLEDs also often use at least one of a fine metal mask and a common metal mask as necessary in forming function layers, such as a hole injection layer, a hole transport layer, an electron transport layer, and an electron injection layer, and often use a common metal mask in forming a transparent common electrode composed of a transparent metal oxide.

As such, a configuration has been proposed where a substrate in which OLEDs or QLEDs are to be provided is provided with spacers for placing an evaporation mask, such as a fine metal mask or a common metal mask, at a predetermined height measured from the substrate.

Unfortunately, the foregoing evaporation mask and spacers come into contact together, thus breaking the spacers, and the yield of the display device is lowered by foreign substances generated from these spacers.

Patent Literature 1 discloses a configuration where a plurality of first photo-spacers having first fixed heights are provided in the display region, and where a plurality of second photo-spacers having second fixed heights greater than those of the plurality of first photo-spacers are provided in a frame region around the display region. In this configuration, the evaporation mask that is a fine metal mask firstly comes into contact with the plurality of second photo-spacers, provided in the frame region and having greater heights, and then comes into contact with the plurality of first photo-spacers, provided in the display region and having smaller heights, thereby preventing the plurality of first photo-spacers in the display region from breakage resulting from the contact with the fine metal mask, thereby improving the yield of the display device.

CITATION LIST

Patent Literature

[Patent Literature 1] International Publication No. WO2020/039555 A1

SUMMARY

Technical Problem

Process steps for manufacturing an OLED display device or a QLED display device typically include performing an inspection to detect a defect or other things in the substrate with the foregoing components including the spacers formed thereon, because materials for forming the function layers, such as the hole injection layer, hole transport layer, electron transport layer, and electron injection layer, and for forming the light-emitting layers are relatively expensive.

Moreover, such an inspection to detect a defect or other things needs to be performed more precisely; hence, the need for applying automated optical inspection (AOI) has increased.

However, in the foregoing configuration in Patent Literature 1, although the plurality of first photo-spacers provided in the display region are lower than the plurality of second photo-spacers provided in the frame region around the display region, the plurality of first photo-spacers need to be relatively high, because in the display region, the plurality of first photo-spacers and the evaporation mask come into direct contact together, and the distance between the substrate, in which OLEDs or QLEDs are to be provided, and the evaporation mask is maintained by the heights of the plurality of first photo-spacers. Thus, when automated optical inspection (AOI) is applied to the configuration in Patent Literature 1, the site where these relatively high first photo-spacers are provided is detected as being normal, whereas the site where the relatively high first photo-spacers are not provided is detected as having a defect. The site detected as having a defect is possibly a site where the first photo-spacers were not formed in view of the design of the display device, or a site where the first photo-spacers were not formed as a matter of process step; hence, it is unfortunately impossible to judge whether this defect detection is a false detection.

A possible way to solve this problem is performing an automated optical inspection at the same pitches as the pitches (intervals) at which the first photo-spacers are provided in view of the design of the display device, but when the pitches at which the first photo-spacers are provided in view of the design of the display device are relatively large, it is unfortunately impossible to perform an automated optical inspection at shorter pitches than the pitches of the first photo-spacers more precisely.

Forming the foregoing first photo-spacers at shorter pitches is one possible way to perform an automated optical inspection at shorter pitches more precisely, but all the plurality of first photo-spacers come into direct contact with the evaporation mask, as earlier described, thus increasing the possibility of a foreign-substance transfer (a transfer of the evaporation material) resulting from the contact with the evaporation mask, thus unfortunately possibly lowering the yield of the display device.

In view of the foregoing problems, one aspect of the present disclosure can offer a display device that can more precisely perform an automated optical inspection (AOI) to detect a defect or other things, without lowering the yield of the display device, and the aspect can offer a method for manufacturing such a display device.

Solution to Problem

To solve the foregoing problems, a display device in the present disclosure includes the following:

a substrate;

a thin-film transistor layer provided on the substrate;

a display region provided with a plurality of subpixels on the thin-film transistor layer, the plurality of subpixels each including a light-emitting element in which a first electrode, a function layer including a light-emitting layer, and a second electrode are provided in the stated order from the thin-film transistor layer;

a plurality of first spacers provided at a first pitch that is constant, in a given direction in the display region except where the light-emitting elements are provided, the plurality of first spacers having heights that are identical; and $n-1$ second spacers provided between two of the plurality of first spacers adjacent to each other in the given direction, except where the light-emitting elements are provided, the $n-1$ second spacers having heights that are smaller than the heights of the plurality of first spacers, where n is a natural number equal to or greater than two.

The pitch in the given direction of all spacers including the plurality of first spacers and the $n-1$ second spacers is a second pitch that is constant, and that is the first pitch divided into n equal parts.

To solve the foregoing problems, a method for manufacturing a display device in the present disclosure includes the following steps:

forming a thin-film transistor layer onto a substrate;

forming a first electrode onto the thin-film transistor layer;

forming spacers by forming a plurality of first spacers having heights that are identical, at a first pitch that is constant, in a given direction outside an end of the first electrode including a region except where the first electrode is provided, by forming $n-1$ second spacers having heights that are smaller than the heights of the plurality of first spacers, between two of the plurality of first spacers adjacent to each other in the given direction, outside an end of the first electrode including the region except where the first electrode is provided, where n is a natural number equal to or greater than two, and by setting the pitch in the given direction of all spacers including the plurality of first spacers and the $n-1$ second spacers at a second pitch that is constant, and that is the first pitch divided into n equal parts;

forming a function layer including a light-emitting layer, by placing an evaporation mask in such a manner that the evaporation mask comes into contact with the plurality of first spacers, and by evaporating the light-emitting layer into a predetermined shape via the evaporation mask; and forming a second electrode onto the function layer including the light-emitting layer.

Advantageous Effect of Disclosure

The aspect of the present disclosure can offer a display device that can more precisely perform an automated optical inspection (AOI) to detect a defect or other things, without lowering the yield of the display device, and the aspect can offer a method for manufacturing such a display device.

BRIEF DESCRIPTION OF DRAWINGS

FIG. 6 shows an example series of process steps for forming an edge cover layer, the first spacers and the second spacers, in the process steps for manufacturing the display device in the first embodiment shown in FIG. 5.

FIG. 7 shows another example series of process steps for forming the edge cover layer, the first spacers and the second spacers, in the process steps for manufacturing the display device in the first embodiment shown in FIG. 5.

FIG. 15 illustrates the schematic configuration of the display region of a display device in a fifth embodiment.

FIG. 16 illustrates the schematic configuration of the display region of a display device in a sixth embodiment.

DESCRIPTION OF EMBODIMENTS

The following describes embodiments of the present disclosure with reference to FIG. 1 through FIG. 16. For convenience in description, components having the same functions as those of components described in a particular embodiment will be denoted by the same signs, and their description will be omitted in some cases.

First Embodiment

Figure 1:
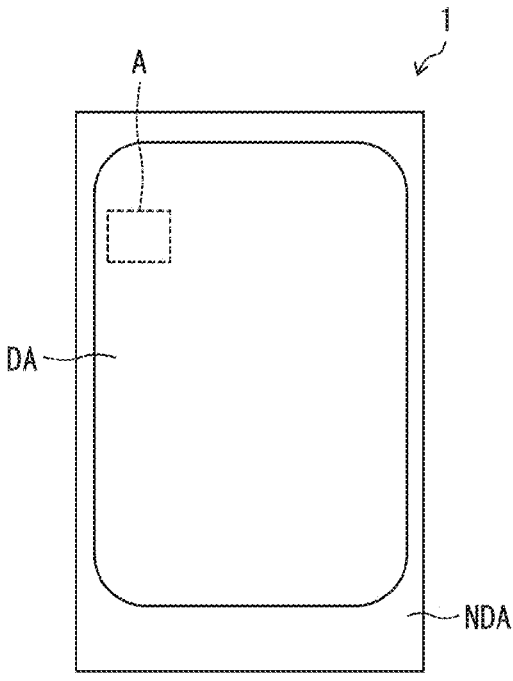
FIG. 1 is a plan view of the schematic configuration of a display device in a first embodiment.

FIG. 1 is a plan view of the schematic configuration of a display device 1 in a first embodiment.

As illustrated in FIG. 1, the display device 1 has a display region DA and a frame region provided around the display region DA.

Figure 2:
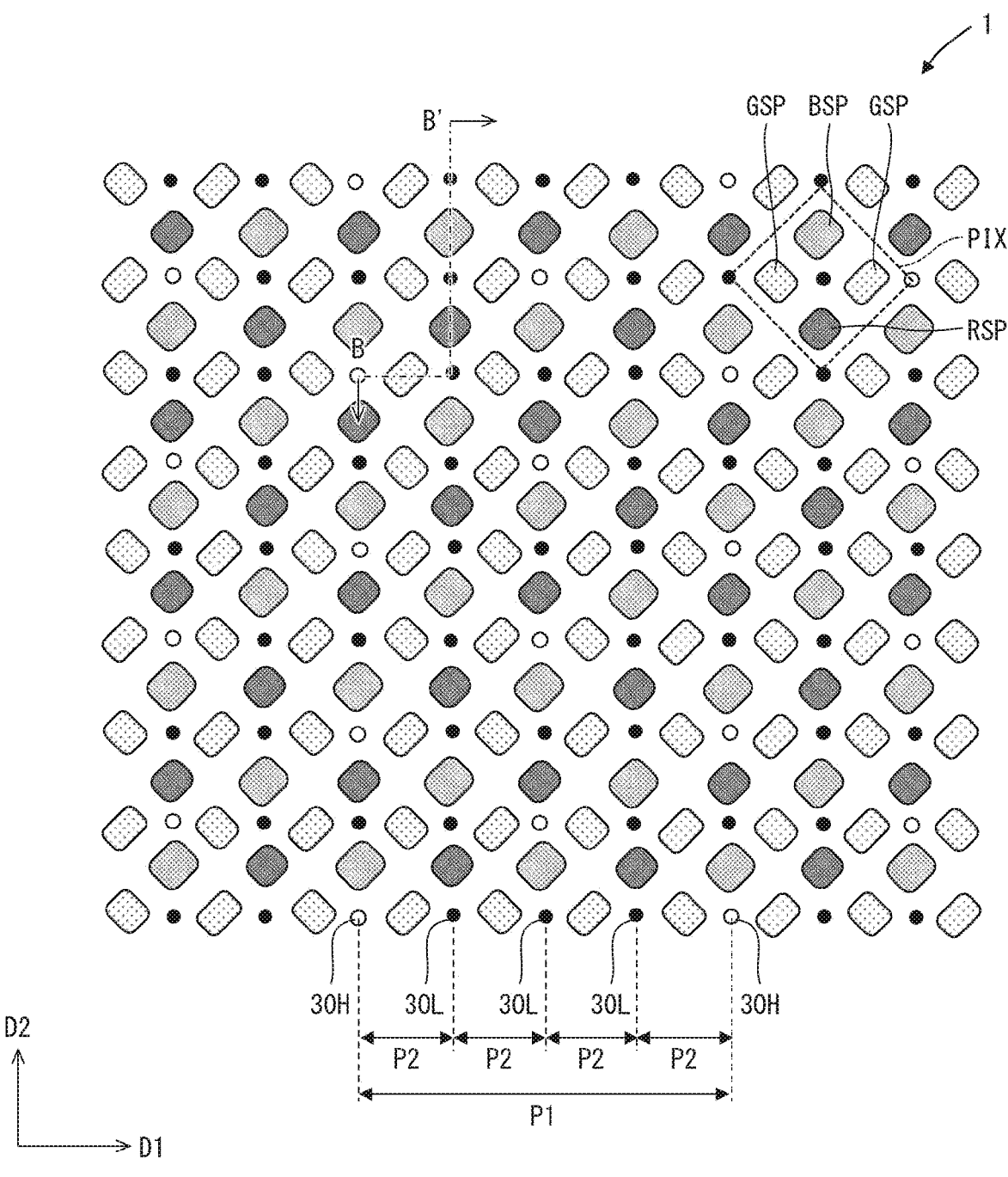
FIG. 2 illustrates the schematic configuration of Portion A of the display region of the display device illustrated in FIG. 1.

FIG. 2 illustrates the schematic configuration of Portion A of the display region DA of the display device 1 in the first embodiment illustrated in FIG. 1.

As illustrated in FIG. 2, the display region DA of the display device 1 is provided with a plurality of pixels PIX, and each pixel PIX includes a red subpixel RSP, a green subpixel GSP, and a blue subpixel BSP. This embodiment describes a non-limiting instance where a single pixel PIX is composed of a single red subpixel RSP, two green subpixels GSP, and a single blue subpixel BSP. For instance, a single pixel PIX may be composed of a single red subpixel RSP, a single green subpixel GSP, and a single blue subpixel BSP, or the single pixel PIX may further include a subpixel of another color in addition to the red subpixel RSP, green subpixel GSP and blue subpixel BSP. It is noted that although this embodiment describes an instance where a single red subpixel RSP, two green subpixels GSP, and a single blue subpixel BSP adjacent to one another constitute a single diamond-shaped pixel PIX, that is, a diamond pentile pixel array, any pixel array may be provided as will be described in third to sixth embodiments.

Figure 3:
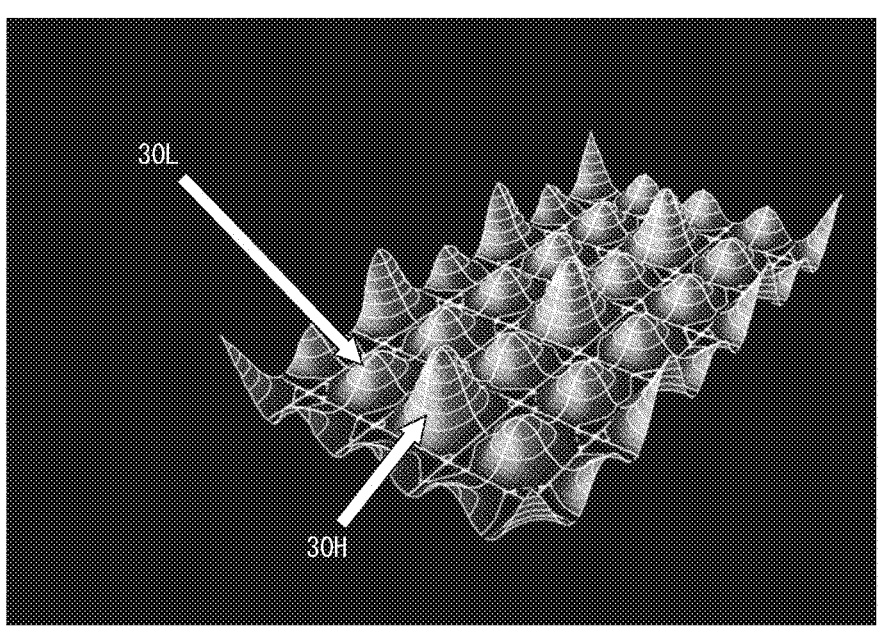
FIG. 3 illustrates first spacers and second spacers provided in the display device in the first embodiment.

FIG. 3 illustrates first spacers 30H and second spacers 30L provided in the display device 1 in the first embodiment.

Figure 4:
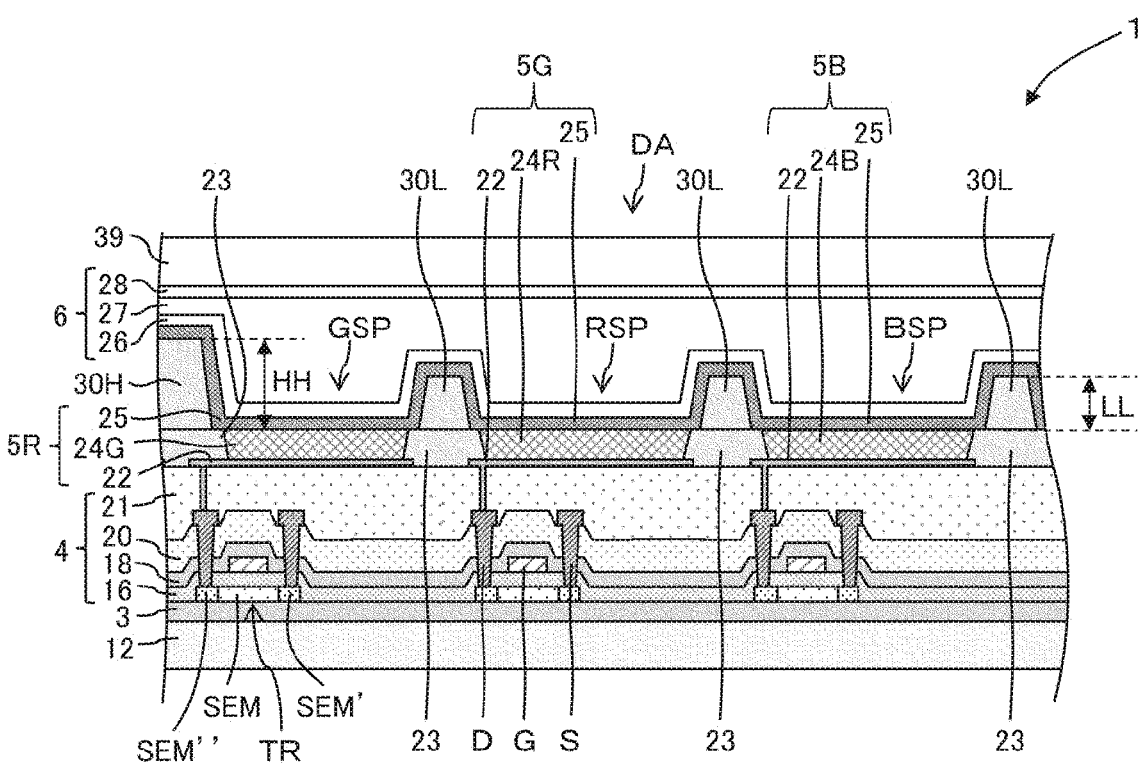
FIG. 4 is a sectional view of the display region of the display device in the first embodiment, taken along line B-B' in FIG. 2.

FIG. 4 is a sectional view of the display region DA of the display device 1 in the first embodiment, taken along line B-B' in FIG. 2.

As illustrated in FIG. 4, the display region DA of the display device 1 is provided with the following on a substrate 12 in the stated order from the substrate 12: a barrier layer 3; a thin-film transistor layer 4 including transistors TR; red light-emitting elements 5R, green light-emitting elements 5G, blue light-emitting elements 5B, an edge cover layer 23, the first spacers 30H and second spacers 30L, which will be described later on with reference to FIG. 3; a sealing layer 6; and a function film 39.

A red subpixel RSP provided in the display region DA of the display device 1 includes a red light-emitting element 5R (first light-emitting element), a green subpixel GSP provided in the display region DA of the display device 1 includes a green light-emitting element 5G (second light-emitting element), and a blue subpixel BSP provided in the display region DA of the display device 1 includes a blue light-emitting element 5B (third light-emitting element). The red light-emitting element 5R included in the red subpixel RSP includes the following: a first electrode 22 (anode); a function layer 24R including a red light-emitting layer; and a second electrode 25 (cathode), the light-emitting element 5G included in the green subpixel GSP includes the following: the first electrode 22 (anode); a function layer 24G including a green light-emitting layer; and the second electrode 25 (cathode), and the blue light-emitting element 5B included in the blue subpixel BSP includes the following: the first electrode 22 (anode); a function layer 24B including a blue light-emitting layer; and the second electrode 25 (cathode).

The substrate 12 illustrated in FIG. 4 may be, for instance, a resin substrate made of a resin material, such as polyimide, or a glass substrate. This embodiment describes a non-limiting instance where a resin substrate made of a resin material, such as polyimide, is used as the substrate 12 so that the display device 1 is a flexible display device. A glass substrate can be used as the substrate 12 when the display device 1 is an inflexible display device.

The barrier layer 3 illustrated in FIG. 4 is a layer that protects the transistors TR, red light-emitting elements 5R, green light-emitting elements 5G and blue light-emitting elements 5B from intrusion of foreign substances, such as water and oxygen, and can be composed of, for instance, a silicon oxide film, a silicon nitride film, or a silicon oxide nitride film, all of which are formed through CVD, or a laminated film of these materials.

A transistor TR portion of the thin-film transistor layer 4 including the transistors TR illustrated in FIG. 4 includes the following: a semiconductor film SEM and doped semiconductor films SEM' and SEM"; an inorganic insulating film 16; a gate electrode G; an inorganic insulating film 18; an inorganic insulating film 20; a source electrode S and a drain electrode D; and a flattening film 21, and a portion of the thin-film transistor layer 4 including the transistors TR, except the transistor TR portion, includes the inorganic insulating film 16, the inorganic insulating film 18, the inorganic insulating film 20, and the flattening film 21.

The semiconductor films SEM, SEM' and SEM" may be composed of, for instance, low-temperature polysilicon (LTPS) or an oxide semiconductor (e.g., In—Ga—Zn—O semiconductor). Although this embodiment describes, by way of example, an instance where the transistors TR are of top gate structure, the transistors TR may be of bottom gate structure.

The gate electrode G, the source electrode S, and the drain electrode D can be composed of, for instance, a metal monolayer film containing at least one of aluminum, tungsten, molybdenum, tantalum, chromium, titanium and copper, or a metal laminated film of these materials.

The inorganic insulating film 16, the inorganic insulating film 18, and the inorganic insulating film 20 can be composed of, for instance, a silicon oxide film, a silicon nitride film, or a silicon oxide nitride film, all of which are formed through CVD, or a laminate of these films.

The flattening film 21 can be composed of, for instance, an organic material that can be applied, such as polyimide or acrylic.

The red light-emitting element 5R includes the following: the first electrode 22 (anode) over the flattening film 21; the function layer 24R including the red light-emitting layer; and the second electrode 25 (cathode), the green light-emitting element 5G includes the following: the first electrode 22 (anode) over the flattening film 21; the function layer 24G including the green light-emitting layer; and the second electrode 25 (cathode), and the blue light-emitting element 5B includes the following: the first electrode 22 (anode) over the flattening film 21; the function layer 24B including the blue light-emitting layer; and the second electrode 25 (cathode). It is noted that the edge cover layer 23, which is insulating, covering the edge of the first electrode 22 (anode) can be formed by, for instance, applying an organic material, such as polyimide or acrylic, followed by patterning through photolithography.

The function layer 24R including the red light-emitting layer can be composed of, for instance, a stack of, in sequence on the first electrode 22 (anode), a hole injection layer, a hole transport layer, the red light-emitting layer, an electron transport layer, and an electron injection layer. One or more of the layers of the function layer 24R including the red light-emitting layer may be omitted as appropriate except the red light-emitting layer.

The function layer 24G including the green light-emitting layer can be composed of, for instance, a stack of, in sequence on the first electrode 22 (anode), a hole injection layer, a hole transport layer, the green light-emitting layer, an electron transport layer, and an electron injection layer. One or more of the layers of the function layer 24G including the green light-emitting layer may be omitted as appropriate except the green light-emitting layer.

The function layer 24B including the blue light-emitting layer can be composed of, for instance, a stack of, in sequence on the first electrode 22 (anode), a hole injection layer, a hole transport layer, the blue light-emitting layer, an electron transport layer, and an electron injection layer. One or more of the layers of the function layer 24B including the blue light-emitting layer may be omitted as appropriate except the blue light-emitting layer.

Further, this embodiment describes a non-limiting instance where the function layer 24R including the red light-emitting layer, the function layer 24G including the green light-emitting layer, and the function layer 24B including the blue light-emitting layer include their respective hole injection layers formed in the same process step using the same material, their respective hole transport layers formed in the same process step using the same material, their respective electron transport layers formed in the same process step using the same material, and their respective electron injection layers formed in the same process step using the same material. For instance, the hole injection layers included in the respective function layers 24R, 24G and 24B may be formed of mutually different materials; alternatively, for instance, the hole injection layers included in respective two of the function layers 24R, 24G and 24B may be formed in the same process step using the same material, and only the hole injection layer included in the remaining function layer may be formed in a different process step using a different material. Further, for instance, the hole transport layers included in the respective function layers 24R, 24G and 24B may be formed of mutually different materials; alternatively, for instance, the hole transport layers included in respective two of the function layers 24R, 24G and 24B may be formed in the same process step using the same material, and only the hole transport layer included in the remaining function layer may be formed in a different process step using a different material. Further, for instance, the electron transport layers included in the respective function layers 24R, 24G and 24B may be formed of mutually different materials; alternatively, for instance, the electron transport layers included in respective two of the function layers 24R, 24G and 24B may be formed in the same process step using the same material, and only the electron transport layer included in the remaining function layer may be formed in a different process step using a different material. Furthermore, for instance, the electron injection layers included in the respective function layers 24R, 24G and 24B may be formed of mutually different materials; alternatively, for instance, the electron injection layers included in respective two of the function layers 24R, 24G and 24B may be formed in the same process step using the same material, and only the electron injection layer included in the remaining function layer may be formed in a different process step using a different material.

Although this embodiment describes, by way of example, an instance where the red light-emitting element 5R, the green light-emitting element 5G, and the blue light-emitting element 5B are organic light-emitting diodes (OLEDs), the red light-emitting element 5R, the green light-emitting element 5G, and the blue light-emitting element 5B may be quantum-dot light-emitting diodes (QLEDs); furthermore, one or some of the red light-emitting element 5R, green light-emitting element 5G, and blue light-emitting element 5B may be OLEDs, and the other or others may be QLEDs. It is noted that the light-emitting layer included in the light-emitting element of each color is a an organic light-emitting layer formed through, for instance, evaporation when the red light-emitting element 5R, the green light-emitting element 5G, and the blue light-emitting element 5B are OLEDs, and the light-emitting layer included in the light-emitting element of each color is a quantum-dot-containing light-emitting layer formed through, for instance, application or ink-jet printing when the red light-emitting element 5R, the green light-emitting element 5G, and the blue light-emitting element 5B are QLEDs.

A control circuit including the transistor TR that controls a corresponding one of the red light-emitting element 5R, green light-emitting element 5G, and blue light-emitting element 5B is provided in the thin-film transistor layer 4 including the transistor TR, for each of the red subpixel RSP, green subpixel GSP, and blue subpixel BSP. It is noted that the control circuit including the transistor TR, provided for each of the red subpixel RSP, green subpixel GSP, and blue subpixel BSP, and the light-emitting element are together also referred to as a subpixel circuit.

The red light-emitting element 5R, green light-emitting element 5G, and blue light-emitting element 5B illustrated in FIG. 4 may be a top-emission type or a bottom-emission type. Since the red light-emitting element 5R, the green light-emitting element 5G, and the blue light-emitting element 5B have a forward-stack structure where the first electrode 22 (anode), the function layer 24R, 24G or 24B, and the second electrode 25 (cathode) are formed on the substrate 12 in the stated order, the second electrode 25 (cathode) is disposed over the first electrode 22 (anode); accordingly, for a top-emission type, the first electrode 22 (anode) needs to be formed of an electrode material that reflects visible light, and the second electrode 25 (cathode) needs to be formed of an electrode material that transmits visible light; in addition, for a bottom-emission type, the first electrode 22 (anode) needs to be formed of an electrode material that transmits visible light, and the second electrode 25 (cathode) needs to be formed of an electrode material that reflects visible light. In contrast, when the red light-emitting element 5R, the green light-emitting element 5G, and the blue light-emitting element 5B have an inverted-stack structure where the first electrode 22 (cathode), the function layer 24R, 24G or 24B, and the second electrode 25 (anode) are formed on the substrate 12 in the stated order, the second electrode 25 (anode) is disposed over the first electrode 22 (cathode); accordingly, for a top-emission type, the first electrode 22 (cathode) needs to be formed of an electrode material that reflects visible light, and the second electrode 25 (anode) needs to be formed of an electrode material that transmits visible light; in addition, for a bottom-emission type, the second electrode 25 (anode) needs to be formed of an electrode material that reflects visible light, and the first electrode 22 (cathode) needs to be formed of an electrode material that transmits visible light.

The electrode material that reflects visible light may be any material that can reflect visible light, and that is conductive; examples include a metal material, such as Al, Mg, Li or Ag, an alloy of the metal material, a stack of the metal material and a transparent metal oxide (e.g., an indium tin oxide, an indium zinc oxide, and an indium gallium zinc oxide), and a stack of the alloy and transparent metal oxide.

In contrast, the electrode material that transmits visible light may be any material that can transmit visible light, and that is conductive; examples include a transparent metal oxide (e.g., an indium tin oxide, an indium zinc oxide, and an indium gallium zinc oxide), and a thin film made of a metal material, such as Al, Mg, Li, or Ag.

The first electrode 22 and the second electrode 25 can be formed through a typical method of electrode formation; examples include physical vapor deposition (PVD), such as vacuum evaporation, sputtering, EB evaporation, or ion plating and include chemical vapor deposition (CVD). Further, patterning the first electrode 22 and the second electrode 25 may be performed in any method through which these electrodes can be formed into their desired patterns accurately; specific examples include photolithography and ink-jet printing.

The sealing layer 6 illustrated in FIG. 4 is a light-transparency film and can be composed of, for instance, the inorganic sealing film 26 covering the second electrode 25, the organic film 27 over the inorganic sealing film 26, and the inorganic sealing film 28 over the organic film 27. The sealing layer 6 avoids foreign substances, such as water and oxygen, from permeating the red light-emitting elements 5R, the green light-emitting elements 5G and the blue light-emitting elements 5B.

The inorganic sealing film 26 and the inorganic sealing film 28 are each an inorganic film and can be composed of, for instance, a silicon oxide film, a silicon nitride film, or a silicon oxide nitride film, all of which are formed through CVD, or a laminate of these films. The organic film 27 is an organic light-transparency film having a flattening effect and can be composed of, for instance, an organic material that can be applied, such as acrylic. The organic film 27 may be formed through, for instance, ink-jet printing. Although this embodiment describes, by way of example, an instance where the sealing layer 6 is formed of two inorganic films and one organic film provided between the two inorganic films, the order of stacking two inorganic films and one organic film is not limited to what is described herein. Furthermore, the sealing layer 6 may be composed of only an inorganic film, composed of only an organic film, composed of one inorganic film and two organic films or composed of two or more inorganic films and two or more organic films.

The function film 39 illustrated in FIG. 4 is a film having at least one of, for instance, the function of optical compensation, the function of touch sensing, and the function of protection.

The first spacers 30H and second spacers 30L provided in the display region DA of the display device 1 will be described with reference to FIG. 2, FIG. 3 and FIG. 4.

As illustrated in FIG. 2, FIG. 3 and FIG. 4, a plurality of first spacers 30H having heights that are identical are provided at a first pitch P1 that is constant, in a first direction D1, which is the side-to-side direction of FIG. 2, in the display region DA of the display device 1 except where the red light-emitting element 5R (an overlap of the first electrode 22, function layer 24R, and second electrode 25), the green light-emitting element 5G (an overlap of the first electrode 22, function layer 24G, and second electrode 25), and the blue light-emitting element 5B (an overlap of the first electrode 22, function layer 24B, and second electrode 25) are provided.

Further, n−1 (n is a natural number equal to or greater than two) second spacers 30L having heights that are smaller than the heights of the first spacers 30H are provided between two of the first spacers 30H adjacent to each other in the first direction D1, which is the side-to-side direction of FIG. 2, except where the red light-emitting element 5R, the green light-emitting element 5G, and the blue light-emitting element 5B are provided. This embodiment describes a non-limiting instance where the alphabet n is four, and where three second spacers 30L having heights that are smaller than the heights of the first spacers 30H are provided between two of the first spacers 3 OH adjacent to each other in the first direction D1, which is the side-to-side direction of FIG. 2. For instance, a single second spacer 30L having a height that is smaller than the heights of the first spacers 30H may be provided between two of the first spacers 30H adjacent to each other in the first direction D1, which is the side-to-side direction of FIG. 2.

As illustrated in FIG. 2, in the display region DA of the display device 1, the pitch in the first direction D1, which is the side-to-side direction of the drawing, of all spacers including the first spacers 30H and second spacers 30L is a second pitch P2 that is constant, and that is the first pitch P1 divided into n equal parts.

In the display region DA of the display device 1, to perform an automated optical inspection (AOI) at shorter pitches more precisely, n−1 (n is a natural number equal to or greater than two) second spacers 30L having heights that are smaller than the heights of the first spacers 30H are provided between two of the first spacers 30H adjacent to each other in the first direction D1, which is the side-to-side direction of FIG. 2. Accordingly, even an automated optical inspection (AOI) at the shorter second pitches P2, each of which is 1/n of the first pitch P1, in the first direction D1, which is the side-to-side direction of FIG. 2, does not exhibit a detection indicating that there is a defect at the sites where the first spacers 30H and second spacers 30L are provided. This is because that the automated optical inspection (AOI) exhibits a detection indicating that both of the site where the first spacers 30H are provided, and the site where the second spacers 30L, having heights that are smaller than the heights of the first spacers 30H, are provided are normal.

Further, as illustrated in FIG. 4, in the display region DA of the display device 1, since the height, LL, of each second spacer 30L provided on the edge cover layer 23 is lower than the height, HH, of each first spacer 30H provided on the edge cover layer 23, only the first spacers 30H come into direct contact with an evaporation mask, and the second spacers 30L do not come into direct contact with the evaporation mask. Hence, the display device 1 does not increase the possibility of a foreign-substance transfer (a transfer of the evaporation material) resulting from the contact with the evaporation mask though the display device 1 includes the second spacers 30L between two of the first spacers 30H adjacent to each other in the first direction D1, which is the side-to-side direction of FIG. 2, and can thus more precisely perform an automated optical inspection (AOI) at shorter pitches.

That is, the red light-emitting layer, the green light-emitting layer, and the blue light-emitting layer can be formed through evaporation using an evaporation mask, which is herein a fine metal mask. The display device 1 includes the following spacers: the plurality of first spacers 30H having heights that are identical; and the second spacers 30L having heights that are smaller than the heights of the first spacers 30H. Thus, the evaporation mask does come into contact with the higher first spacers 30H, but does not come into contact with the lower second spacers 30L. This can reduce the area of contact between the evaporation mask and spacers, thereby preventing foreign substances formed on the second spacers 30L, such as the evaporation material, from being transferred to the evaporation mask.

As described above, the display device 1 can more precisely perform an automated optical inspection (AOI) to detect a defect or other things, without lowering the yield of the display device 1 caused by a foreign-substance transfer (a transfer of an evaporation material) resulting from contact with an evaporation mask.

It is noted that this embodiment describes, by way of example, that the second pitch P2 is 175 μm or smaller so that the inspection pitch in an automated optical inspection (AOI) can be set at 175 μm or smaller.

Further, in the display region DA of the display device 1, a single green subpixel GSP is disposed between two spacers adjacent to each other in the first direction D1, which is the side-to-side direction of FIG. 2, among all the spacers including the first spacers 30H and second spacers 30L, as illustrated in FIG. 2. This enables the inspection pitch in an automated optical inspection (AOI) to be set on a single-subpixel basis and thus enables a precise automated optical inspection (AOI).

This embodiment has described a non-limiting instance where, as illustrated in FIG. 4, the first spacers 30H and the second spacers 30L are provided on the edge cover layer 23, which is a region except where the red light-emitting elements 5R, the green light-emitting elements 5G, and the blue light-emitting elements 5B are provided. For a display device provided with no edge cover layer 23, the first spacers 30H and the second spacers 30L may be provided between, for instance, adjacent first electrodes, except where the red light-emitting elements 5R, the green light-emitting elements 5G, and the blue light-emitting elements 5B are provided.

It is noted that the first spacers 30H and the second spacers 30L may be formed in different process steps using different materials, or in the same process step or different process steps using the same material. This embodiment describes a non-limiting instance where the first spacers 30H and the second spacers 30L are formed of the same material. The first spacers 30H and the second spacers 30L may be formed of, for instance, a material for forming the edge cover layer 23; for instance, these spacers can be formed by applying an organic material, such as polyimide or acrylic, followed by patterning through photolithography. This embodiment describes, by way of example, that the edge cover layer 23 is formed of a photosensitive polyimide material, and that the first spacers 30H and the second spacers 30L are formed of a photosensitive acrylic material.

For forming the first spacers 30H and the second spacers 30L using the same material, like this embodiment, the first spacers 30H and the second spacers 30L can be formed in the same process step, and the first spacers 30H and the second spacers 30L have the same transmittance property for each film thickness, thus facilitating their thickness design.

Further, for instance, the first spacers 30H, the second spacers 30L, and the edge cover layer 23 may be formed of the same material. The first spacers 30H, second spacers 30L, and edge cover layer 23 in this case can be formed of a photosensitive polyimide material or a photosensitive acrylic material. For forming the first spacers 30H, the second spacers 30L, and the edge cover layer 23 using the same material, the first spacers 30H, the second spacers 30L, and the edge cover layer 23 can be formed in the same process step, and the first spacers 30H, the second spacers 30L, and the edge cover layer 23 have the same transmittance property for each film thickness, thus facilitating their thickness design.

It is noted that the first spacers 30H and the second spacers 30L are preferably provided also in the frame region NDA, provided around the display region DA illustrated in FIG. 1, in a manner similar to those in the display region DA illustrated in FIG. 2. That is, in the frame region NDA of the display device 1 as well, the pitch in the first direction D1, which is the side-to-side direction of FIG. 2, of all the spacers including the first spacers 30H and second spacers 30L is preferably set to be the second pitch P2 that is constant, and that is the first pitch P1, which is a pitch between the first spacers 30H adjacent to each other in the first direction D, divided into n equal parts. Such a configuration enables not only a fine metal mask, but also a common metal mask to be disposed at a predetermined height measured from the substrate. Further, in the frame region NDA as well, like in the display region DA, the display device 1 can more precisely perform an automated optical inspection (AOI) to detect a defect or other things, without lowering its yield caused by a foreign-substance transfer (a transfer of an evaporation material) resulting from contact with the evaporation mask. Although not shown, the first spacers 30H and second spacers 30L in this embodiment are provided also in the frame region NDA, provided around the display region DA illustrated in FIG. 1, in a manner similar to those in the display region DA illustrated in FIG. 2.

As illustrated in FIG. 4, the sealing layer 6 including the organic film 27 is provided over the display region DA of the display device 1.

The organic film 27 included in the sealing layer 6 can be formed by, for instance, application through ink-jet printing; since the first spacers 30H and the second spacers 30L, which is lower than the first spacers 30H, are provided in the display region DA of the display device 1, the organic film 27, when applied through ink-jet printing, easily extends via the lower second spacers 30L, thus enabling improvement in the capability of application of the organic film 27.

Figure 5:
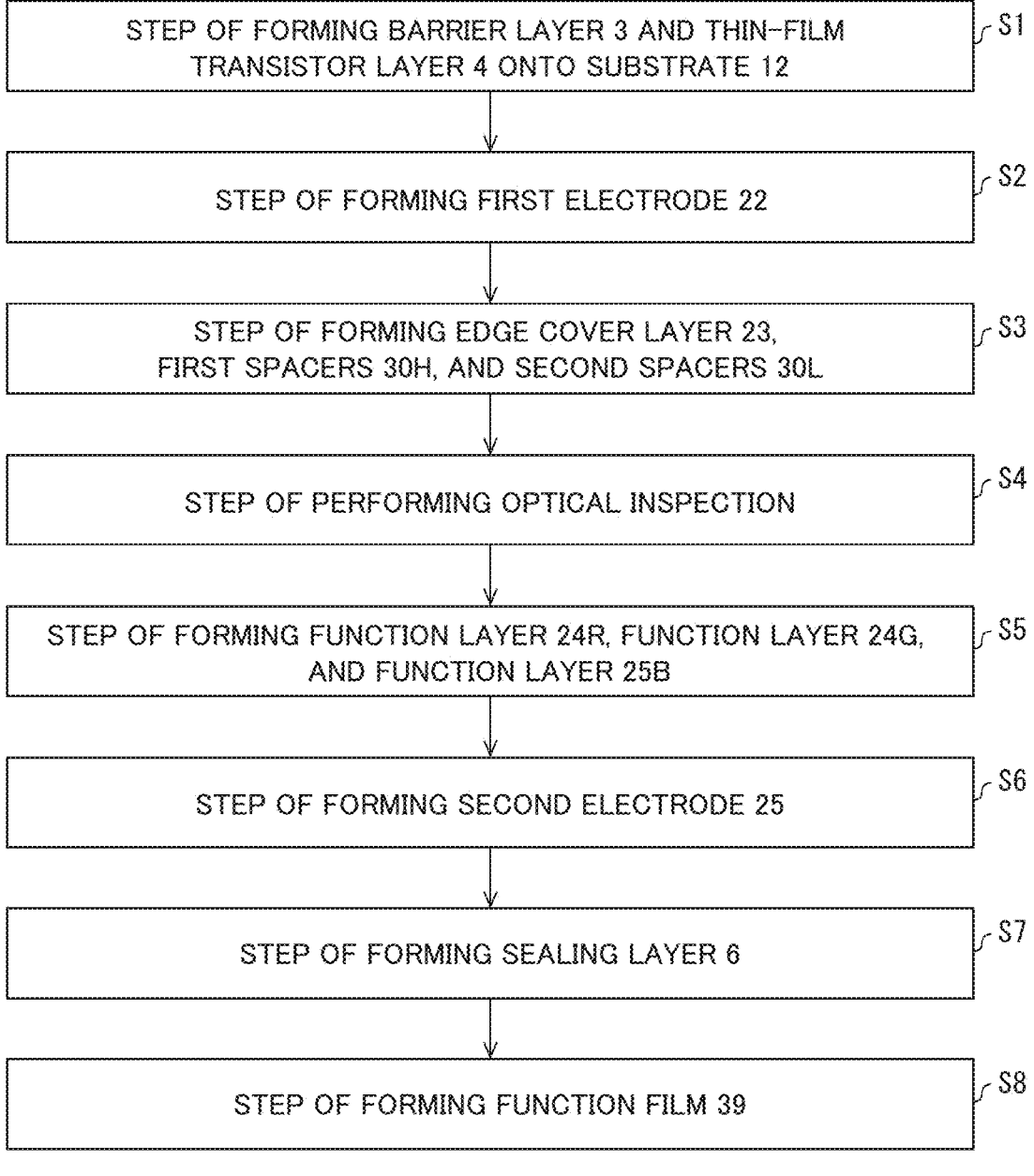
FIG. 5 illustrates process steps for manufacturing the display device in the first embodiment.

FIG. 5 illustrates process steps for manufacturing the display device 1 in the first embodiment.

The process steps for manufacturing the display device 1 include the following, as illustrated in FIG. 5: a step (Step S1) of forming the barrier layer 3 and the thin-film transistor layer 4 onto a substrate (12); a step (Step S2) of forming the first electrode 22 onto the thin-film transistor layer 4; a step (Step S3) of forming the edge cover layer 23 that is insulating and covers the edge of the first electrode 22, and forming the first spacers 30H and the second spacers 30L; a step (Step S4) of performing an optical inspection; a step (Step S5) of forming the function layer 24R including the red light-emitting layer, the function layer 24G including the green light-emitting layer, and the function layer 24B including the blue light-emitting layer; a step (Step S6) of forming the second electrode 25; a step (Step S7) of forming the sealing layer 6; and a step (Step S8) of forming the function film 39.

The step (Step S3) of forming the edge cover layer 23, the first spacers 30H, and the second spacers 30L includes forming the spacers 30H and 30L by, as earlier described with reference to FIG. 2, FIG. 3, and FIG. 4, forming a plurality of first spacers 30H having heights that are identical, at the first pitch P1 that is constant, in the first direction D1, which is the side-to-side direction of FIG. 2, outside an end of the first electrode 22 including a region except where the first electrode 22 is provided, by forming n−1 (n is a natural number equal to or greater than two) second spacers 30L having heights that are smaller than the heights of the first spacers 30H, between two of the first spacers 30H adjacent to each other in the first direction D1, outside an end of the first electrode 22 including the region except where the first electrode 22 is provided, and by setting the pitch in the first direction D1 of all the spacers 30H and 30L including the first spacers 30H and second spacers 30L at the second pitch P2 that is constant, and that is the first pitch P1 divided into n equal parts. Furthermore, the edge cover layer 23, which is insulating and covers the edge of the first electrode 22, can be formed before the spacers 30H and 30L are formed, or when the spacers 30H and 30L are formed. In this embodiment, the edge cover layer 23 is formed before the formation of the spacers 30H and 30L, and the first spacers 30H and the second spacers 30L are formed onto the edge cover layer 23.

The inspection pitch in the step (Step S4) of performing the optical inspection can be the second pitch P2. It is noted that the step (Step S4) of performing the optical inspection is performed between the step (Step S3) of forming the edge cover layer 23, first spacers 30H and second spacers 30L, and the step (Step S5) of forming the function layer 24R including the red light-emitting layer, the function layer 24G including the green light-emitting layer, and the function layer 24B including the blue light-emitting layer.

In the step (Step S5) of forming the function layer 24R including the red light-emitting layer, the function layer 24G including the green light-emitting layer, and the function layer 24B including the blue light-emitting layer, three different evaporation masks, which are herein fine metal masks, are used in at least steps of forming the red light-emitting layer, the green light-emitting layer, and the blue light-emitting layer.

The step of forming the red light-emitting layer includes the following: placing an evaporation mask, which is a fine metal mask, for forming a red light-emitting layer in such a manner that the evaporation mask comes into contact with the first spacers 30H; and evaporating the red light-emitting layer at a site corresponding to the red subpixels RSP via the evaporation mask for forming the red light-emitting layer.

The step of forming the green light-emitting layer includes the following: placing an evaporation mask, which is a fine metal mask, for forming a green light-emitting layer in such a manner that the evaporation mask comes into contact with the first spacers 30H; and evaporating the green light-emitting layer at a site corresponding to the green subpixels GSP via the evaporation mask for forming the green light-emitting layer.

The step of forming the blue light-emitting layer includes the following: placing an evaporation mask, which is a fine metal mask, for forming a blue light-emitting layer in such a manner that the evaporation mask comes into contact with the first spacers 30H; and evaporating the blue light-emitting layer at a site corresponding to the blue subpixels BSP via the evaporation mask for forming the blue light-emitting layer.

It is noted that in the step (Step S5) of forming the function layer 24R including the red light-emitting layer, the function layer 24G including the green light-emitting layer, and the function layer 24B including the blue light-emitting layer, at least one of a fine metal mask and a common metal mask is used as necessary, in steps of forming the hole injection layer, the hole transport layer, the electron transport layer, and the electron injection layer, other than the steps of forming the red light-emitting layer, the green light-emitting layer, and the blue light-emitting layer.

It is also noted that an evaporation mask, which is a common metal mask, for forming a second electrode is used in the step (Step S6) of forming the second electrode 25.

When a fine metal mask is used in Step S5, the fine metal mask is placed so as to come into contact with the first spacers 30H.

In contrast, when a common metal mask is used in Step S5 and Step S6, the common metal mask is placed so as to come into contact with the first spacers 30H in the frame region NDA, because the display device 1 includes the first spacers 30H and second spacers 30L also in the frame region NDA, provided around the display region DA, in a manner similar to those in the display region DA.

The step (Step S7) of forming the sealing layer 6 includes providing the sealing layer 6 including the organic film 27 over the display region DA of the display device 1. The organic film 27 included in the sealing layer 6 can be formed through, for instance, ink-jet printing. The display device 1 includes, in the display region DA, the first spacers 30H and the second spacers 30L lower than the first spacers 30H; thus, the organic film 27, when applied through ink-jet printing, easily extends via the lower second spacers 30L, thus enabling improvement in the capability of application of the organic film 27.

FIG. 6 shows an example series of process steps for forming the edge cover layer 23, first spacers 30H, and second spacers 30L, in the process steps for manufacturing the display device 1 in the first embodiment shown in FIG. 5.

As illustrated in FIG. 6, a step (Step S11) of applying a first photosensitive resin that constitutes the edge cover layer 23 can use, for instance, a photosensitive polyimide material as the first photosensitive resin. Thereafter, in a step (Step S12) of forming the edge cover layer 23 by patterning the applied first photosensitive resin, the applied photosensitive polyimide material undergoes exposure and development, so that it can be patterned into a predetermined shape. Then, a step (Step S13) of applying a second photosensitive resin that constitutes the first spacers 30H and second spacers 30L can use, for instance, a photosensitive acrylic material as the second photosensitive resin. Then, through a step (Step S14) of exposing the applied second photosensitive resin by using a gray tone mask (half-tone mask), followed by a step (Step 15) of forming the first spacers 30H and the second spacers 30L through development, followed by a step (Step 16) of heat treatment, the first spacers 30H and the second spacers 30L formed of a material different from that of the edge cover layer 23 can be formed at a predetermined height in a predetermined location, in this embodiment, on the edge cover layer 23.

FIG. 6 illustrates an instance where the edge cover layer 23, and the first and second spacers 30H and 30L are formed in different process steps using different materials, whereas FIG. 7 illustrates an instance where the edge cover layer 23, and the first and second spacers 30H and 30L are formed in the same process step using the same material.

FIG. 7 shows another example series of process steps for forming the edge cover layer 23, first spacers 30H, and second spacers 30L, in the process steps for manufacturing the display device 1 in the first embodiment shown in FIG. 5.

As illustrated in FIG. 7, a step (Step S21) of applying a third photosensitive resin that constitutes the edge cover layer 23, the first spacers 30H, and the second spacers 30L can use, for instance, a photosensitive polyimide material or a photosensitive acrylic material as the third photosensitive resin. Then, through a step (Step S22) of exposing the applied third photosensitive resin by using a gray tone mask (half-tone mask), followed by a step (Step 23) of forming the edge cover layer 23, the first spacers 30H, and the second spacers 30L through development, followed by a step (Step 24) of heat treatment, the first spacers 30H and the second spacers 30L formed of the same material as that of the edge cover layer 23 can be formed at a predetermined height in a predetermined location, in this embodiment, on the edge cover layer 23. It is noted that the edge cover layer 23, the first spacers 30H, and the second spacers 30L are formed in the same process step simultaneously.

The following describes a preferable ratio of (the heights of the second spacers 30L/the heights of the first spacers 30H) with reference to FIG. 8, FIG. 9, FIG. 10, and FIG. 11.

Figure 8:
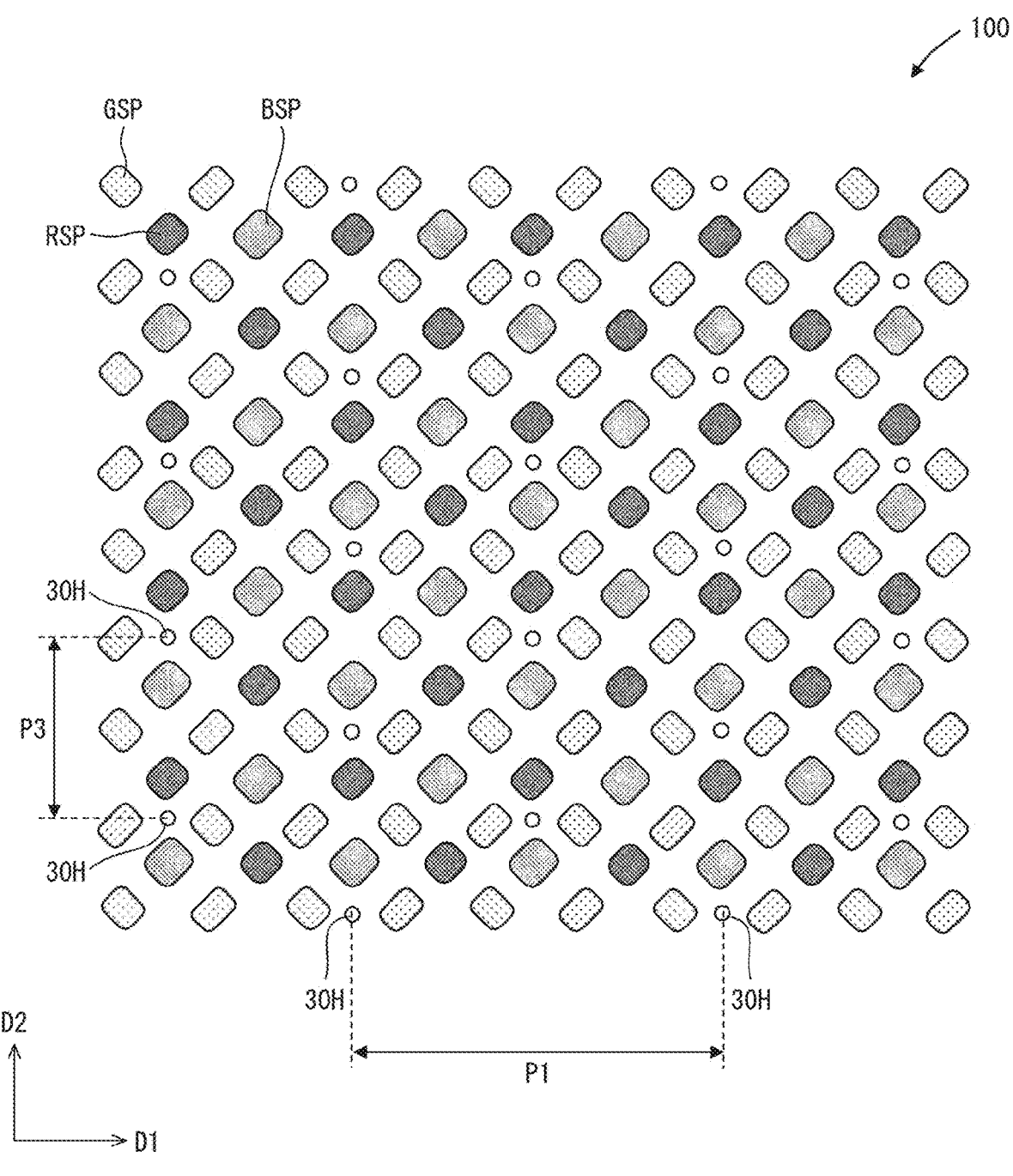
FIG. 8 illustrates the schematic configuration of the display region of a display device, which is a comparative example, provided with only the first spacers.

FIG. 8 illustrates the schematic configuration of the display region DA of a display device 100, which is a comparative example, provided with only the first spacers 30H.

As illustrated in FIG. 8, the display device 100 in the comparative example is configured such that a plurality of first spacers 30H having heights that are identical are provided at the first pitch P1 that is constant, in the first direction D1, which is the side-to-side direction of FIG. 8. Thus, an automated optical inspection (AOI) in the first direction D1 at shorter pitches than the first pitch P1 cannot be performed, because such an automated optical inspection (AOI) in the first direction D1 at shorter pitches than the first pitch P1 exhibits a detection indicating that there is a defect at the sites where the first spacers 30H are not provided.

As illustrated in FIG. 8, the display device 100 in the comparative example is also configured such that a plurality of first spacers 30H having heights that are identical are provided at a third pitch P3 that is constant, in a second direction D2, which is the up-and-down direction of FIG. 8. Thus, an automated optical inspection (AOI) in the second direction D2 at shorter pitches than the third pitch P3 cannot be performed, because such an automated optical inspection (AOI) in the second direction D2 at shorter pitches than the third pitch P3 exhibits a detection indicating that there is a defect at the sites where the first spacers 30H are not provided.

Figure 9:
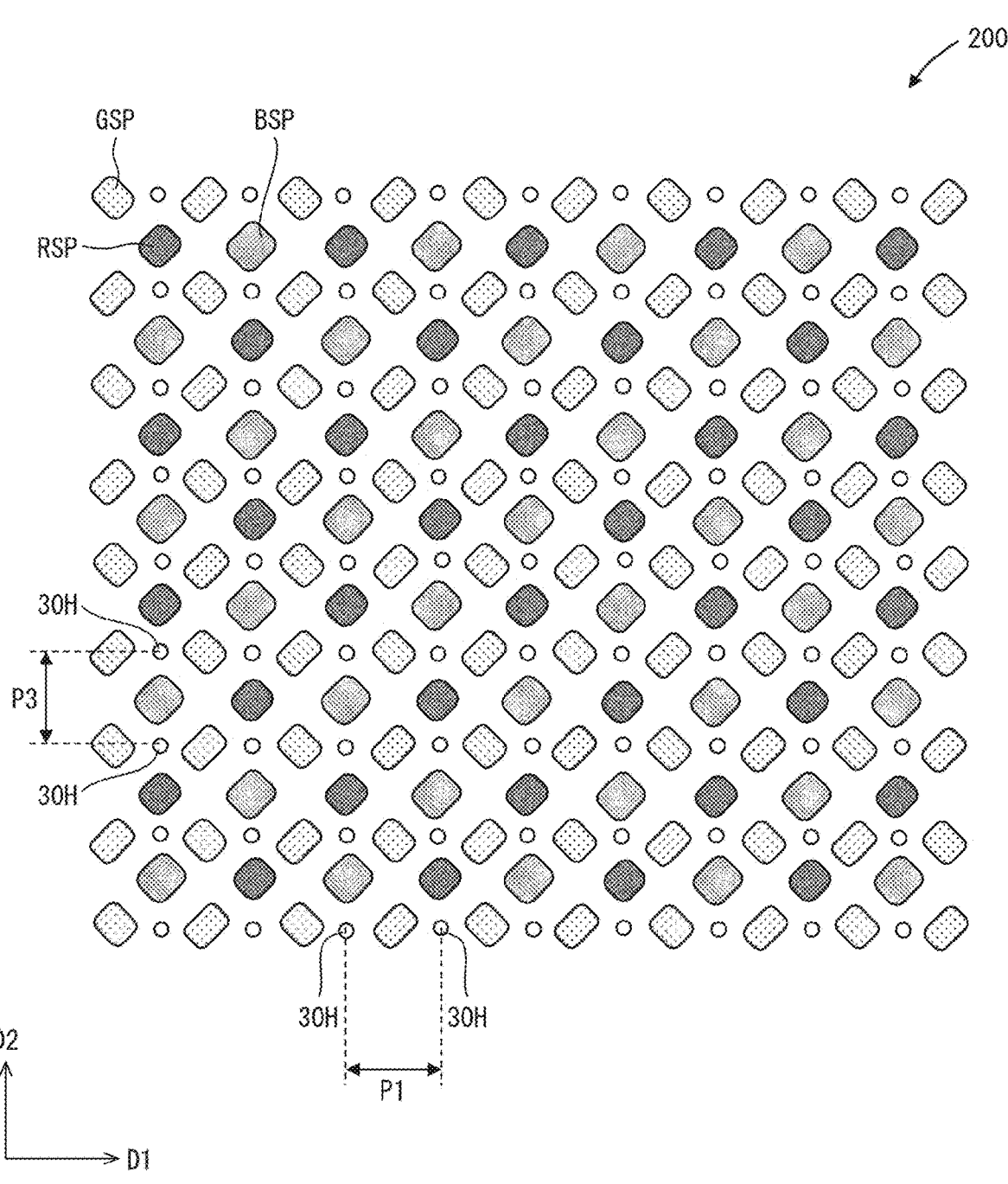
FIG. 9 illustrates the schematic configuration of the display region of a display device, which is another comparative example, provided with only the first spacers.

FIG. 9 illustrates the schematic configuration of the display region DA of a display device 200, which is another comparative example, provided with only the first spacers 30H.

As illustrated in FIG. 9, the display device 200 in the comparative example is configured such that a plurality of first spacers 30H having heights that are identical are provided at the first pitch P1 that is constant, in the first direction D1, which is the side-to-side direction of FIG. 9. This enables an automated optical inspection (AOI) to be performed at the relatively short first pitches P1 in the first direction D1. The display device 200 in the comparative example is also configured such that a plurality of first spacers 30H having heights that are identical are provided at the third pitch P3 that is constant, in the second direction D2, which is the up-and-down direction of FIG. 9. This enables an automated optical inspection (AOI) to be performed at the relatively short third pitches P3 in the second direction D2. However, in the display device 200 illustrated in FIG. 9, all the plurality of first spacers 30H, having heights that are identical, come into contact with an evaporation mask, thus causing a foreign-substance transfer (a transfer of an evaporation material), thereby lowering the yield of the display device 200.

Figures 10, 11:
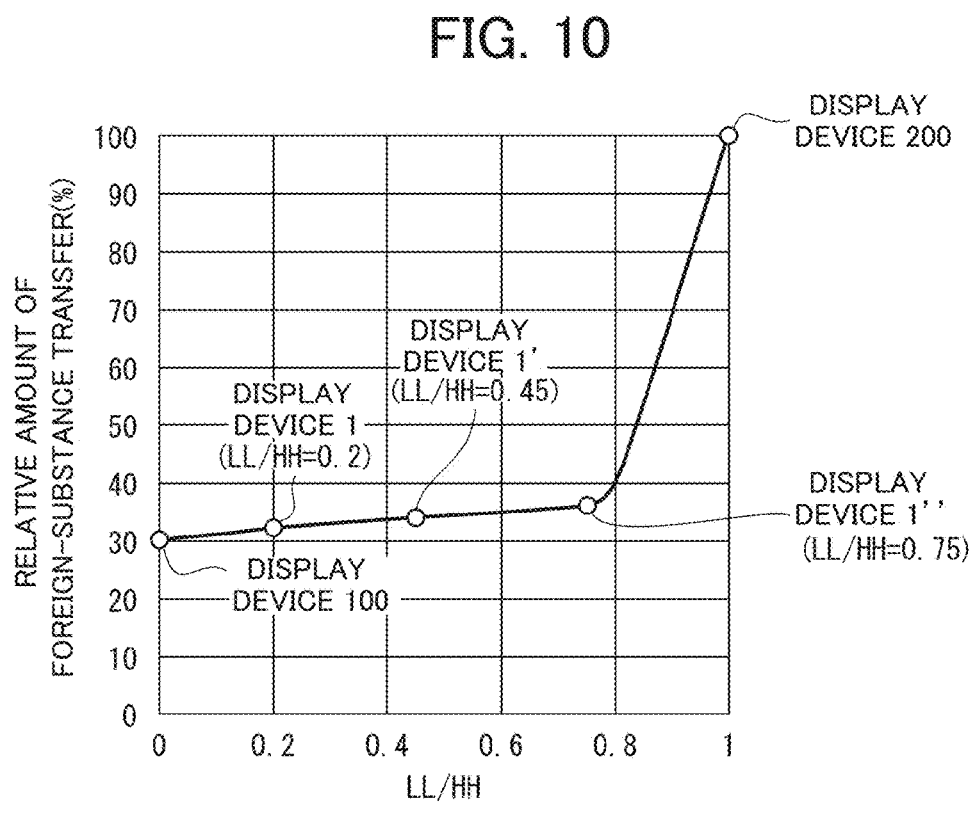
FIG. 10 shows the relationship between the heights of the second spacers/the heights of the first spacers, and the relative amount of foreign-substance transfer, in display devices in the first embodiment.
FIG. 11 shows the following characteristics with regard to the relative amount of foreign-substance transfer, to the presence or absence of a false detection in high-sensitivity inspection, and to the capability of ink-jet application: the characteristics of the display device illustrated in FIG. 8, which is a comparative example provided with only the first spacers; the characteristics of the display device illustrated in FIG. 9, which is another comparative example provided with only the first spacers; and the characteristics of the display devices in the first embodiment, with the ratios of the heights of the second spacers/the heights of the first spacers standing at 0.2, 0.45 and 0.75.

FIG. 10 shows the relationship between the ratio of (the heights LL of the second spacers 30L/the heights HH of the first spacers 30H) and the relative amount of foreign-substance transfer, in the display device 1, a display device 1' and a display device 1" in the first embodiment.

FIG. 10 reveals that when the ratio of (the heights LL of the second spacers 30L/the heights HH of the first spacers 30H) stands at 0 to 0.75 inclusive, that is, when the heights LL of the second spacers 30L are 75% or smaller of the heights HH of the first spacers 30H, the relative amount of foreign-substance transfer stands at 36%, which indicates that the relative amount is favorable. However, FIG. 10 reveals that when the ratio of (the heights LL of the second spacers 30L/the heights HH of the first spacers 30H) stands at 0.76 or greater, that is, when the heights LL of the second spacers 30L are 76% or greater of the heights HH of the first spacers 30H, the relative amount of foreign-substance transfer increases considerably.

FIG. 11 shows the following characteristics with regard to the relative amount of foreign-substance transfer, to the presence or absence of a false detection in high-sensitivity inspection, and to the capability of ink-jet application: the characteristics of the display device 100 illustrated in FIG. 8, which is a comparative example provided with only the first spacers 30H; the characteristics of the display device 200 illustrated in FIG. 9, which is another comparative example provided with only the first spacers 30H; and the characteristics of the display devices 1, 1' and 1" in the first embodiment, with the ratios of the heights of the second spacers/the heights of the first spacers standing at 0.2, 0.45 and 0.75.

It is noted that the double circles in FIG. 11 indicate a very good capability of ink-jet (IJ) application, that the circles in FIG. 11 indicate a good capability of ink-jet (IJ) application, and that the cross in FIG. 11 indicates a poor capability of ink-jet (IJ) application.

As shown in FIG. 11, the display device 100 illustrated in FIG. 8, which is a comparative example provided with only the first spacers 30H, has a relatively large first pitch P1 and thus exhibits a very good capability of IJ application, but in an automated optical inspection (AOI) at shorter pitches than the first pitch P1, the display device 100 involves a detection (false detection) indicating that where the first spacers 30H are not provided has a defect. The display device 200 illustrated in FIG. 9, which is another comparative example provided with only the first spacers 30H, has a relatively small first pitch P1 and thus involves no false detection in an automated optical inspection (AOI) at the relatively small first pitches P1, but the display device 200 exhibits a poor capability of IJ application because only the high first spacers 30H are formed at the relatively small first pitches P1.

In contrast, all of the display device 1, with the ratio of (the heights LL of the second spacers 30L/the heights HH of the first spacers 30H) standing at 0.2, the display device 1', with the ratio of (the heights LL of the second spacers 30L/the heights HH of the first spacers 30H) standing at 0.45, and the display device 1", with the ratio of (the heights LL of the second spacers 30L/the heights HH of the first spacers 30H) standing at 0.75, involve no false detection even in an automated optical inspection (AOI) at the second pitches P2 shorter than the first pitch P1 and exhibit a good capability of IJ application. It is noted that the display device 1, with the ratio of (the heights LL of the second spacers 30L/the heights HH of the first spacers 30H) standing at 0.2, has the best capability of IJ application, and that the display device 1', with the ratio of (the heights LL of the second spacers 30L/the heights HH of the first spacers 30H) standing at 0.45, has a better capability of IJ application than the display device 1", with the ratio of (the heights LL of the second spacers 30L/the heights HH of the first spacers 30H) standing at 0.75.

As such, the ratio of (the heights LL of the second spacers 30L/the heights HH of the first spacers 30H) preferably stands at 0.2 to 0.75 inclusive.

The foregoing configuration, with the heights LL of the second spacers 30L standing at 20% or greater of the heights HH of the first spacers 30H, can prevent the second spacers 30L from a false detection in an automated optical inspection (AOI). Furthermore, the foregoing configuration, which includes, as spacers, the plurality of first spacers 30H having heights that are identical, and the second spacers 30L having heights that stand at 20 to 75% inclusive of the heights HH of the first spacers 30H, can improve the application capability of the organic film 27 included in the sealing layer 6, in forming the organic film 27 through ink-jet printing.

Second Embodiment

Figure 12:
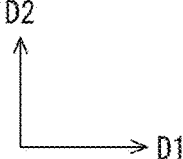
FIG. 12 illustrates the schematic configuration of the display region of a display device in a second embodiment.

The following describes a second embodiment of the present disclosure with reference to FIG. 12. A display device 50 in this embodiment is different from that in the first embodiment in that n−1 (n is a natural number equal to or greater than two) second spacers 30L having heights that are smaller than the heights of the first spacers 30H are provided between two of the first spacers 30H adjacent to each other in the second direction D2. The others have been described in the first embodiment. For convenience in description, components having the same functions as the components illustrated in the drawings related to the first embodiment will be denoted by the same signs, and their description will be omitted.

FIG. 12 illustrates the schematic configuration of the display region DA of the display device 50 in the second embodiment.

As illustrated in FIG. 12, a plurality of first spacers 30H having heights that are identical are provided at a first pitch P3 that is constant, in the second direction D2, which is the up-and-down direction of FIG. 12, in the display region DA of the display device 50 except where the red light-emitting element 5R (an overlap of the first electrode 22, function layer 24R, and second electrode 25), the green light-emitting element 5G (an overlap of the first electrode 22, function layer 24G, and second electrode 25), and the blue light-emitting element 5B (an overlap of the first electrode 22, function layer 24B, and second electrode 25) are provided.

Further, n−1 (n is a natural number equal to or greater than two) second spacers 30L having heights that are smaller than the heights of the first spacers 30H are provided between two of the first spacers 30H adjacent to each other in the second direction D2, which is the up-and-down direction of FIG. 12, except where the red light-emitting element 5R, the green light-emitting element 5G, and the blue light-emitting element 5B are provided. This embodiment describes a non-limiting instance where the alphabet n is two, and where a single second spacer 30L having a height that is smaller than the heights of the first spacers 30H is provided between two of the first spacers 30H adjacent to each other in the second direction D2, which is the up-and-down direction of FIG. 12.

As illustrated in FIG. 12, in the display region DA of the display device 50, the pitch in the second direction D2, which is the up-and-down direction of the drawing, of all spacers including the first spacers 30H and second spacers 30L is a second pitch P4 that is constant, and that is the first pitch P3 divided into n equal parts.

In the display region DA of the display device 50, to perform an automated optical inspection (AOI) at shorter pitches more precisely, n−1 (n is a natural number equal to or greater than two) second spacers 30L having heights that are smaller than the heights of the first spacers 30H are provided between two of the first spacers 30H adjacent to each other in the second direction D2, which is the up-and-down direction of FIG. 12. Accordingly, even an automated optical inspection (AOI) at the shorter second pitches P4, each of which is 1/n of the first pitch P3, in the second direction D2, which is the up-and-down direction of FIG. 12, does not exhibit a detection indicating that there is a defect at the sites where the first spacers 30H and second spacers 30L are provided.

The display device 50 does not increase the possibility of a foreign-substance transfer (a transfer of an evaporation material) resulting from contact with an evaporation mask though the display device 50 includes the second spacer 30L between two of the first spacers 30H adjacent to each other in the second direction D2, which is the up-and-down direction of FIG. 12, and can thus more precisely perform an automated optical inspection (AOI) at shorter pitches.

As described above, the display device 50 can more precisely perform an automated optical inspection (AOI) to detect a defect or other things, without lowering the yield of the display device 50 caused by a foreign-substance transfer (a transfer of an evaporation material) resulting from contact with an evaporation mask.

Third Embodiment

Figure 13:
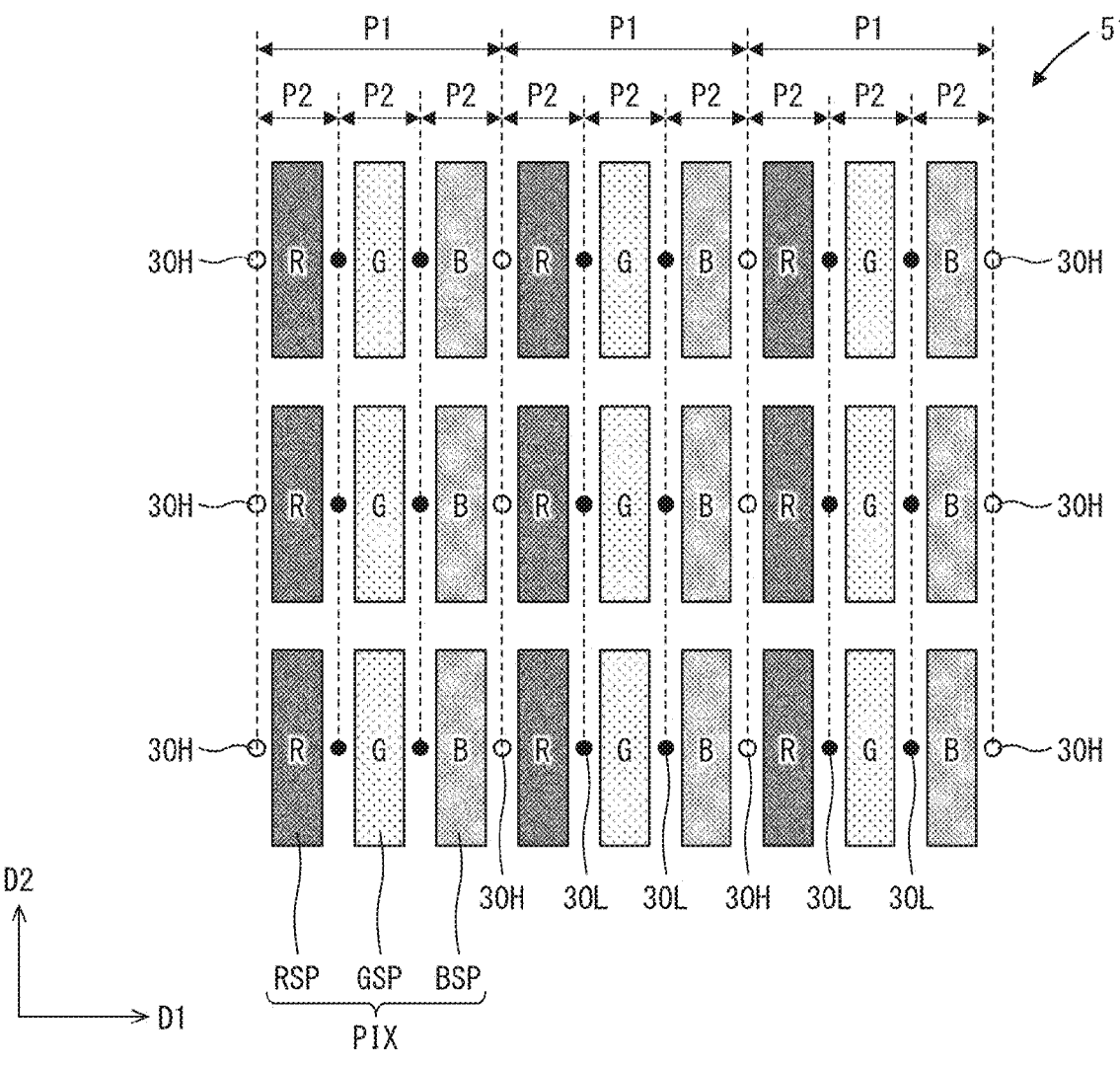
FIG. 13 illustrates the schematic configuration of the display region of a display device in a third embodiment.

The following describes a third embodiment of the present disclosure with reference to FIG. 13. A display device 51 in this embodiment is different from those in the first and second embodiments in that a single pixel PIX is composed of a single rectangular red subpixel RSP, a single rectangular green subpixel GSP, and a single rectangular blue subpixel BSP. The others have been described in the first and second embodiments. For convenience in description, components having the same functions as the components illustrated in the drawings related to the first and second embodiments will be denoted by the same signs, and their description will be omitted.

FIG. 13 illustrates the schematic configuration of the display region DA of the display device 51 in the third embodiment.

As illustrated in FIG. 13, a plurality of first spacers 30H having heights that are identical are provided at the first pitch P1 that is constant, in the first direction D1, which is the side-to-side direction of FIG. 13, in the display region DA of the display device 51 except where the red light-emitting element 5R (an overlap of the first electrode 22, function layer 24R, and second electrode 25), the green light-emitting element 5G (an overlap of the first electrode 22, function layer 24G, and second electrode 25), and the blue light-emitting element 5B (an overlap of the first electrode 22, function layer 24B, and second electrode 25) are provided.

Further, n−1 (n is a natural number equal to or greater than two) second spacers 30L having heights that are smaller than the heights of the first spacers 30H are provided between two of the first spacers 30H adjacent to each other in the first direction D1, which is the side-to-side direction of FIG. 13, except where the red light-emitting element 5R, the green light-emitting element 5G, and the blue light-emitting element 5B are provided. This embodiment describes a non-limiting instance where the alphabet n is three, and where two second spacers 30L having heights that are smaller than the heights of the first spacers 30H are provided between two of the first spacers 30H adjacent to each other in the first direction D1, which is the side-to-side direction of FIG. 13.

As illustrated in FIG. 13, in the display region DA of the display device 51, the pitch in the first direction D1, which is the side-to-side direction of the drawing, of all spacers including the first spacers 30H and second spacers 30L is the second pitch P2 that is constant, and that is the first pitch P1 divided into n equal parts.

In the display region DA of the display device 51, to perform an automated optical inspection (AOI) at shorter pitches more precisely, n−1 (n is a natural number equal to or greater than two) second spacers 30L having heights that are smaller than the heights of the first spacers 30H are provided between two of the first spacers 30H adjacent to each other in the first direction D1, which is the side-to-side direction of FIG. 13. Accordingly, even an automated optical inspection (AOI) at the shorter second pitches P2, each of which is 1/n of the first pitch P1, in the first direction D1, which is the side-to-side direction of FIG. 13, does not exhibit a detection indicating that there is a defect at the sites where the first spacers 30H and second spacers 30L are provided.

The display device 51 does not increase the possibility of a foreign-substance transfer (a transfer of an evaporation material) resulting from contact with an evaporation mask though the display device 51 includes the second spacers 30L between two of the first spacers 30H adjacent to each other in the first direction D1, which is the side-to-side direction of FIG. 13, and can thus more precisely perform an automated optical inspection (AOI) at shorter pitches.

As described above, the display device 51 can more precisely perform an automated optical inspection (AOI) to detect a defect or other things, without lowering the yield of the display device 51 caused by a foreign-substance transfer (a transfer of an evaporation material) resulting from contact with an evaporation mask.

Fourth Embodiment

Figure 14:
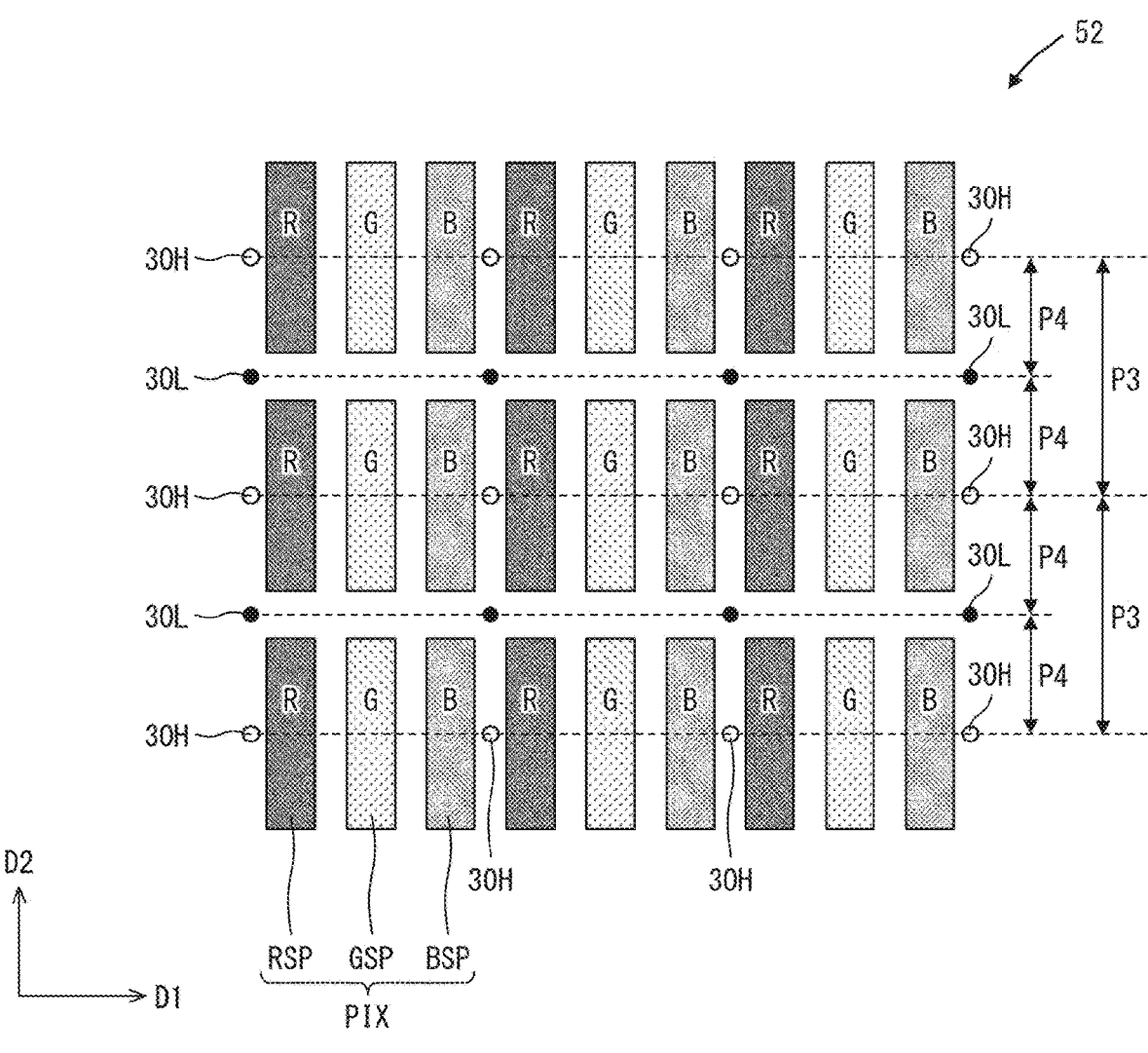
FIG. 14 illustrates the schematic configuration of the display region of a display device in a fourth embodiment.

The following describes a fourth embodiment of the present disclosure with reference to FIG. 14. A display device 52 in this embodiment is different from that in the third embodiment in that n−1 (n is a natural number equal to or greater than two) second spacers 30L having heights that are smaller than the heights of the first spacers 30H are provided between two of the first spacers 30H adjacent to each other in the second direction D2. The others have been described in the third embodiment. For convenience in description, components having the same functions as the components illustrated in the drawings related to the third embodiment will be denoted by the same signs, and their description will be omitted.

FIG. 14 illustrates the schematic configuration of the display region DA of the display device 52 in the fourth embodiment.

As illustrated in FIG. 14, a plurality of first spacers 30H having heights that are identical are provided at the first pitch P3 that is constant, in the second direction D2, which the up-and-down direction of FIG. 14, in the display region DA of the display device 52 except where the red light-emitting element 5R (an overlap of the first electrode 22, function layer 24R, and second electrode 25), the green light-emitting element 5G (an overlap of the first electrode 22, function layer 24G, and second electrode 25), and the blue light-emitting element 5B (an overlap of the first electrode 22, function layer 24B, and second electrode 25) are provided.

Further, n−1 (n is a natural number equal to or greater than two) second spacers 30L having heights that are smaller than the heights of the first spacers 30H are provided between two of the first spacers 30H adjacent to each other in the second direction D2, which is the up-and-down direction of FIG. 14, except where the red light-emitting element 5R, the green light-emitting element 5G, and the blue light-emitting element 5B are provided. This embodiment describes a non-limiting instance where the alphabet n is two, and where a single second spacer 30L having a height that is smaller than the heights of the first spacers 30H is provided between two of the first spacers 30H adjacent to each other in the second direction D2, which is the up-and-down direction of FIG. 14.

As illustrated in FIG. 14, in the display region DA of the display device 52, the pitch in the second direction D2, which is the up-and-down direction of the drawing, of all spacers including the first spacers 30H and second spacers 30L is the second pitch P4 that is constant, and that is the first pitch P3 divided into n equal parts.

In the display region DA of the display device 52, to perform an automated optical inspection (AOI) at shorter pitches more precisely, n−1 (n is a natural number equal to or greater than two) second spacers 30L having heights that are smaller than the heights of the first spacers 30H are provided between two of the first spacers 30H adjacent to each other in the second direction D2, which is the up-and-down direction of FIG. 14. Accordingly, even an automated optical inspection (AOI) at the shorter second pitches P4, each of which is 1/n of the first pitch P3, in the second direction D2, which is the up-and-down direction of FIG. 14, does not exhibit a detection indicating that there is a defect at the sites where the first spacers 30H and second spacers 30L are provided.

The display device 52 does not increase the possibility of a foreign-substance transfer (a transfer of an evaporation material) resulting from contact with an evaporation mask though the display device 52 includes the second spacer 30L between two of the first spacers 30H adjacent to each other in the second direction D2, which is the up-and-down direction of FIG. 14, and can thus more precisely perform an automated optical inspection (AOI) at shorter pitches.

As described above, the display device 52 can more precisely perform an automated optical inspection (AOI) to detect a defect or other things, without lowering the yield of the display device 52 caused by a foreign-substance transfer (a transfer of an evaporation material) resulting from contact with an evaporation mask.

Fifth Embodiment

The following describes a fifth embodiment of the present disclosure with reference to FIG. 15. A display device 53 in this embodiment is different from those in the first to fourth embodiments in that a single pixel PIX is composed of a single red subpixel RSP, a single green subpixel GSP, and a single blue subpixel BSP, and that the placement of the blue subpixel BSP is different between two of the pixels PIX adjacent to each other. The others have been described in the first to fourth embodiments. For convenience in description, components having the same functions as the components illustrated in the drawings related to the first to fourth embodiments will be denoted by the same signs, and their description will be omitted.

FIG. 15 illustrates the schematic configuration of the display region DA of the display device 53 in the fifth embodiment.

As illustrated in FIG. 15, a plurality of first spacers 30H having heights that are identical are provided at the first pitch P1 that is constant, in the first direction D1, which the side-to-side direction of FIG. 15, in the display region DA of the display device 53 except where the red light-emitting element 5R (an overlap of the first electrode 22, function layer 24R, and second electrode 25), the green light-emitting element 5G (an overlap of the first electrode 22, function layer 24G, and second electrode 25), and the blue light-emitting element 5B (an overlap of the first electrode 22, function layer 24B, and second electrode 25) are provided.

Further, n−1 (n is a natural number equal to or greater than two) second spacers 50L having heights that are smaller than the heights of the first spacers 30H are provided between two of the first spacers 30H adjacent to each other in the first direction D1, which is the side-to-side direction of FIG. 15, except where the red light-emitting element 5R, the green light-emitting element 5G, and the blue light-emitting element 5B are provided. This embodiment describes a non-limiting instance where the alphabet n is four, and where three second spacers 30L having heights that are smaller than the heights of the first spacers 30H are provided between two of the first spacers 30H adjacent to each other in the first direction D1, which is the side-to-side direction of FIG. 15.

As illustrated in FIG. 15, in the display region DA of the display device 53, the pitch in the first direction D1, which is the side-to-side direction of the drawing, of all spacers including the first spacers 30H and second spacers 30L is the second pitch P2 that is constant, and that is the first pitch P1 divided into n equal parts.

In the display region DA of the display device 53, to perform an automated optical inspection (AOI) at shorter pitches more precisely, n−1 (n is a natural number equal to or greater than two) second spacers 30L having heights that are smaller than the heights of the first spacers 30H are provided between two of the first spacers 30H adjacent to each other in the first direction D1, which is the side-to-side direction of FIG. 15. Accordingly, even an automated optical inspection (AOI) at the shorter second pitches P2, each of which is 1/n of the first pitch P1, in the first direction D1, which is the side-to-side direction of FIG. 15, does not exhibit a detection indicating that there is a defect at the sites where the first spacers 30H and second spacers 30L are provided.

The display device 53 does not increase the possibility of a foreign-substance transfer (a transfer of an evaporation material) resulting from contact with an evaporation mask though the display device 53 includes the second spacers 50L between two of the first spacers 30H adjacent to each other in the first direction D1, which is the side-to-side direction of FIG. 15, and can thus more precisely perform an automated optical inspection (AOI) at shorter pitches.

As described above, the display device 53 can more precisely perform an automated optical inspection (AOI) to detect a defect or other things, without lowering the yield of the display device 53 caused by a foreign-substance transfer (a transfer of an evaporation material) resulting from contact with an evaporation mask.

Sixth Embodiment

The following describes a sixth embodiment of the present disclosure with reference to FIG. 16. A display device 54 in this embodiment is different from that in the fifth embodiment in that n−1 (n is a natural number equal to or greater than two) second spacers 30L having heights that are smaller than the heights of the first spacers 30H are provided between two of the first spacers 30H adjacent to each other in the second direction D2. The others have been described in the fifth embodiment. For convenience in description, components having the same functions as the components illustrated in the drawings related to the fifth embodiment will be denoted by the same signs, and their description will be omitted.

FIG. 16 illustrates the schematic configuration of the display region DA of the display device 54 in the sixth embodiment.

As illustrated in FIG. 16, a plurality of first spacers 30H having heights that are identical are provided at the first pitch P3 that is constant, in the second direction D2, which the up-and-down direction of FIG. 16, in the display region DA of the display device 54 except where the red light-emitting element 5R (an overlap of the first electrode 22, function layer 24R, and second electrode 25), the green light-emitting element 5G (an overlap of the first electrode 22, function layer 24G, and second electrode 25), and the blue light-emitting element 5B (an overlap of the first electrode 22, function layer 24B, and second electrode 25) are provided.

Further, n−1 (n is a natural number equal to or greater than two) second spacers 30L having heights that are smaller than the heights of the first spacers 30H are provided between two of the first spacers 30H adjacent to each other in the second direction D2, which is the up-and-down direction of FIG. 16, except where the red light-emitting element 5R, the green light-emitting element 5G, and the blue light-emitting element 5B are provided. This embodiment describes a non-limiting instance where the alphabet n is two, and where a single second spacer 30L having a height that is smaller than the heights of the first spacers 30H is provided between two of the first spacers 30H adjacent to each other in the second direction D2, which is the up-and-down direction of FIG. 16.

As illustrated in FIG. 16, in the display region DA of the display device 54, the pitch in the second direction D2, which is the up-and-down direction of the drawing, of all spacers including the first spacers 30H and second spacers 30L is the second pitch P4 that is constant, and that is the first pitch P3 divided into n equal parts.

In the display region DA of the display device 54, to perform an automated optical inspection (AOI) at shorter pitches more precisely, n−1 (n is a natural number equal to or greater than two) second spacers 30L having heights that are smaller than the heights of the first spacers 30H are provided between two of the first spacers 30H adjacent to each other in the second direction D2, which is the up-and-down direction of FIG. 16. Accordingly, even an automated optical inspection (AOI) at the shorter second pitches P4, each of which is 1/n of the first pitch P3, in the second direction D2, which is the up-and-down direction of FIG. 16, does not exhibit a detection indicating that there is a defect at the sites where the first spacers 30H and second spacers 30L are provided.

The display device 54 does not increase the possibility of a foreign-substance transfer (a transfer of an evaporation material) resulting from contact with an evaporation mask though the display device 54 includes the second spacer 30L between two of the first spacers 30H adjacent to each other in the second direction D2, which is the up-and-down direction of FIG. 16, and can thus more precisely perform an automated optical inspection (AOI) at shorter pitches.

As described above, the display device 54 can more precisely perform an automated optical inspection (AOI) to detect a defect or other things, without lowering the yield of the display device 54 caused by a foreign-substance transfer (a transfer of an evaporation material) resulting from contact with an evaporation mask.

Summary

First Aspect

A display device including the following:

a substrate;

a thin-film transistor layer provided on the substrate;

a display region provided with a plurality of subpixels on the thin-film transistor layer, the plurality of subpixels each including a light-emitting element in which a first electrode, a function layer including a light-emitting layer, and a second electrode are provided in the stated order from the thin-film transistor layer;

a plurality of first spacers provided at a first pitch that is constant, in a given direction in the display region except where the light-emitting elements are provided, the plurality of first spacers having heights that are identical; and n−1 second spacers provided between two of the plurality of first spacers adjacent to each other in the given direction, except where the light-emitting elements are provided, the n−1 second spacers having heights that are smaller than the heights of the plurality of first spacers, where n is a natural number equal to or greater than two, wherein the pitch in the given direction of all spacers including the plurality of first spacers and the n−1 second spacers is a second pitch that is constant, and that is the first pitch divided into n equal parts.

Second Aspect

The display device according to the first aspect, wherein the plurality of first spacers and the n−1 second spacers are formed of an identical material.

Third Aspect

The display device according to the first or second aspect, further including an edge cover layer covering the edge of the first electrode, wherein the plurality of first spacers and the n−1 second spacers are provided on the edge cover layer.

Fourth Aspect

The display device according to the third aspect, wherein the edge cover layer, the plurality of first spacers, and the n−1 second spacers are formed of an identical material.

Fifth Aspect

The display device according to any one of the first to fourth aspects, wherein the second pitch is 175 μm or smaller.

Sixth Aspect

The display device according to any one of the first to fifth aspect, wherein one of the plurality of subpixels is disposed between two spacers adjacent to each other in the given direction among all the spacers including the plurality of first spacers and the n−1 second spacers.

Seventh Aspect

The display device according to any one of the first to sixth aspects, wherein the plurality of subpixels include a first subpixel, a second subpixel, and a third subpixel, the first subpixel includes a first light-emitting element as the light-emitting element, the second subpixel includes a second light-emitting element as the light-emitting element, the third subpixel includes a third light-emitting element as the light-emitting element, the first light-emitting element is provided with a first light-emitting layer as the light-emitting layer, the second light-emitting element is provided with, as the light-emitting layer, a second light-emitting layer that is different in emission peak wavelength from the first light-emitting layer, the third light-emitting element is provided with, as the light-emitting layer, a third light-emitting layer that is different in emission peak wavelength from the first light-emitting layer and the second light-emitting layer, and at least one of the first light-emitting layer, the second light-emitting layer, and the third light-emitting layer is made of an organic material.

Eighth Aspect

The display device according to any one of the first to seventh aspects, wherein a sealing layer including an organic film is provided over the display region.

Ninth Aspect

The display device according to any one of the first to eighth aspects, wherein the ratio of the heights of the n−1 second spacers/the heights of the plurality of first spacers stands at 0.2 to 0.75 inclusive.

Tenth Aspect

A method for manufacturing a display device, including the steps of:

forming a thin-film transistor layer onto a substrate;

forming a first electrode onto the thin-film transistor layer;

forming spacers by forming a plurality of first spacers having heights that are identical, at a first pitch that is constant, in a given direction outside an end of the first electrode including a region except where the first electrode is provided, by forming n−1 second spacers having heights that are smaller than the heights of the plurality of first spacers, between two of the plurality of first spacers adjacent to each other in the given direction, outside an end of the first electrode including the region except where the first electrode is provided, where n is a natural number equal to or greater than two, and by setting a pitch in the given direction of all spacers including the plurality of first spacers and the n−1 second spacers at a second pitch that is constant, and that is the first pitch divided into n equal parts;

forming a function layer including a light-emitting layer, by placing an evaporation mask in such a manner that the evaporation mask comes into contact with the plurality of first spacers, and by evaporating the light-emitting layer into a predetermined shape via the evaporation mask; and forming a second electrode onto the function layer including the light-emitting layer.

Eleventh Aspect

The method for manufacturing the display device according to the tenth aspect, further including a step of performing an optical inspection between the step of forming the spacers and the step of forming the function layer including the light-emitting layer, wherein an inspection pitch in the step of performing the optical inspection is the second pitch.

Twelfth Aspect

The method for manufacturing the display device according to the tenth or eleventh aspect, wherein the plurality of first spacers and the n−1 second spacers are formed of an identical material, and the step of forming the spacers includes forming the plurality of first spacers and the n−1 second spacers in an identical process step.

Thirteenth Aspect

The method for manufacturing the display device according to any one of the tenth to twelfth aspects, further including a step of forming an edge cover layer that covers an edge of the first electrode before the step of forming the spacers, wherein the step of forming the spacers includes providing the plurality of first spacers and the n−1 second spacers onto the edge cover layer.

Fourteenth Aspect

The method for manufacturing the display device according to any one of claims 10 to 12, further including a step of forming an edge cover layer that covers an edge of the first electrode before the step of forming the spacers, wherein the edge cover layer, the plurality of first spacers, and the n−1 second spacers are formed of an identical material, and the step of forming the spacers includes forming the edge cover layer, the plurality of first spacers, and the n−1 second spacers in an identical process step.

Fifteenth Aspect

The method for manufacturing the display device according to any one of the tenth to fourteenth aspects, further including a step of forming a sealing layer including an organic film after the step of forming the second electrode, wherein the organic film is formed through ink-jet printing.

Sixteenth Aspect

The method for manufacturing the display device according to any one of the tenth to fifteenth aspects, wherein the step of forming the spacers includes forming the plurality of first spacers and the n−1 second spacers in such a manner that the ratio of the heights of the n−1 second spacers/the heights of the plurality of first spacers satisfies 0.2 to 0.75 inclusive.

Additional Note

The present disclosure is not limited to the foregoing embodiments. Various modifications can be devised within the scope of the claims. An embodiment that is obtained in combination, as appropriate, with the technical means disclosed in the respective embodiments is also included in the technical scope of the present disclosure. Furthermore, combining the technical means disclosed in the respective embodiments can form a new technical feature.

INDUSTRIAL APPLICABILITY

The present disclosure is applicable to a display device and a method for manufacturing the display device.

The invention claimed is:

1. A display device comprising:

a substrate;

a thin-film transistor layer provided on the substrate;

a display region provided with a plurality of subpixels on the thin-film transistor layer, the plurality of subpixels each including a light-emitting element in which a first electrode, a function layer including a light-emitting layer, and a second electrode are provided in a stated order from the thin-film transistor layer;

a plurality of first spacers provided at a first pitch that is constant, in a given direction in the display region except where the light-emitting elements are provided, the plurality of first spacers having heights that are identical; and n−1 second spacers provided between two of the plurality of first spacers adjacent to each other in the given direction, except where the light-emitting elements are provided, the n−1 second spacers having heights that are smaller than the heights of the plurality of first spacers, where n is a natural number equal to or greater than two, wherein a pitch in the given direction of all spacers including the plurality of first spacers and the n−1 second spacers is a second pitch that is constant, and that is the first pitch divided into n equal parts, and wherein a ratio of the heights of the n−1 second spacers to the heights of the plurality of first spacers stands at 0.2 to 0.75 inclusive.

2. The display device according to claim 1, wherein the plurality of first spacers and the n−1 second spacers are formed of an identical material.

3. The display device according to claim 1, further comprising an edge cover layer covering an edge of the first electrode, wherein the plurality of first spacers and the n−1 second spacers are provided on the edge cover layer.

4. The display device according to claim 3, wherein the edge cover layer, the plurality of first spacers, and the n−1 second spacers are formed of an identical material.

5. The display device according to claim 1, wherein the second pitch is 175 μm or smaller.

6. The display device according to claim 1, wherein one of the plurality of subpixels is disposed between two spacers adjacent to each other in the given direction among all the spacers including the plurality of first spacers and the n−1 second spacers.

7. The display device according to claim 1, wherein the plurality of subpixels include a first subpixel, a second subpixel, and a third subpixel, the first subpixel includes a first light-emitting element as the light-emitting element, the second subpixel includes a second light-emitting element as the light-emitting element, the third subpixel includes a third light-emitting element as the light-emitting element, the first light-emitting element is provided with a first light-emitting layer as the light-emitting layer, the second light-emitting element is provided with, as the light-emitting layer, a second light-emitting layer that is different in emission peak wavelength from the first light-emitting layer, the third light-emitting element is provided with, as the light-emitting layer, a third light-emitting layer that is different in emission peak wavelength from the first light-emitting layer and the second light-emitting layer, and at least one of the first light-emitting layer, the second light-emitting layer, and the third light-emitting layer is made of an organic material.

8. The display device according to claim 1, wherein a sealing layer including an organic film is provided over the display region.

9. A method for manufacturing a display device, comprising the steps of:

forming a thin-film transistor layer onto a substrate;

forming a first electrode onto the thin-film transistor layer;

forming spacers by forming a plurality of first spacers having heights that are identical, at a first pitch that is constant, in a given direction outside an end of the first electrode including a region except where the first electrode is provided, by forming n−1 second spacers having heights that are smaller than the heights of the plurality of first spacers, between two of the plurality of first spacers adjacent to each other in the given direction, outside an end of the first electrode including the region except where the first electrode is provided, where n is a natural number equal to or greater than two, and by setting a pitch in the given direction of all spacers including the plurality of first spacers and the n–1 second spacers at a second pitch that is constant, and that is the first pitch divided into n equal parts;

forming a function layer including a light-emitting layer, by placing an evaporation mask in such a manner that the evaporation mask comes into contact with the plurality of first spacers, and by evaporating the light-emitting layer into a predetermined shape via the evaporation mask; and forming a second electrode onto the function layer including the light-emitting layer.

10. The method for manufacturing the display device according to claim 9, further comprising a step of performing an optical inspection between the step of forming the spacers and the step of forming the function layer including the light-emitting layer, wherein an inspection pitch in the step of performing the optical inspection is the second pitch.

11. The method for manufacturing the display device according to claim 9, wherein the plurality of first spacers and the n–1 second spacers are formed of an identical material, and the step of forming the spacers includes forming the plurality of first spacers and the n–1 second spacers in an identical process step.

12. The method for manufacturing the display device according to claim 9, further comprising a step of forming an edge cover layer that covers an edge of the first electrode before the step of forming the spacers, wherein the step of forming the spacers includes providing the plurality of first spacers and the n–1 second spacers onto the edge cover layer.

13. The method for manufacturing the display device according to claim 9, further comprising a step of forming an edge cover layer that covers an edge of the first electrode before the step of forming the spacers, wherein the edge cover layer, the plurality of first spacers, and the n–1 second spacers are formed of an identical material, and the step of forming the spacers includes forming the edge cover layer, the plurality of first spacers, and the n–1 second spacers in an identical process step.

14. The method for manufacturing the display device according to claim 9, further comprising a step of forming a sealing layer including an organic film after the step of forming the second electrode, wherein the organic film is formed through ink-jet printing.

15. The method for manufacturing the display device according to claim 9, wherein the step of forming the spacers includes forming the plurality of first spacers and the n–1 second spacers in such a manner that a ratio of the heights of the n–1 second spacers to the heights of the plurality of first spacers satisfies 0.2 to 0.75 inclusive.

16. A display device comprising:

a substrate;

a thin-film transistor layer provided on the substrate;

a display region provided with a plurality of subpixels on the thin-film transistor layer, the plurality of subpixels each including a light-emitting element in which a first electrode, a function layer including a light-emitting layer, and a second electrode are provided in a stated order from the thin-film transistor layer;

a plurality of first spacers provided at a first pitch that is constant, in a given direction in the display region except where the light-emitting elements are provided, the plurality of first spacers having heights that are identical; and n–1 second spacers provided between two of the plurality of first spacers adjacent to each other in the given direction, except where the light-emitting elements are provided, the n–1 second spacers having heights that are smaller than the heights of the plurality of first spacers, where n is a natural number equal to or greater than two, wherein a pitch in the given direction of all spacers including the plurality of first spacers and the n–1 second spacers is a second pitch that is constant, and that is the first pitch divided into n equal parts, and wherein the second pitch is 175 μm or smaller.

* * * * *